(12) United States Patent
Kikuchi et al.

(10) Patent No.: US 10,121,647 B2
(45) Date of Patent: Nov. 6, 2018

(54) METHOD FOR REMOVING ADHERING MATTER AND DRY ETCHING METHOD

(71) Applicant: CENTRAL GLASS COMPANY, LIMITED, Yamaguchi (JP)

(72) Inventors: Akiou Kikuchi, Yamaguchi (JP); Masanori Watari, Yamaguchi (JP); Kenji Kameda, Toyama (JP); Shin Hiyama, Toyama (JP); Yasutoshi Tsubota, Toyama (JP)

(73) Assignee: CENTRAL GLASS COMPANY, LIMITED, Ube, Yamaguchi (JP)

( * ) Notice: Subject to any disclaimer, the term of this patent is extended or adjusted under 35 U.S.C. 154(b) by 0 days.

(21) Appl. No.: 15/456,759

(22) Filed: Mar. 13, 2017

(65) Prior Publication Data
US 2017/0200602 A1   Jul. 13, 2017

Related U.S. Application Data
(63) Continuation of application No. PCT/JP2015/075368, filed on Sep. 7, 2015.

(30) Foreign Application Priority Data
Sep. 24, 2014 (JP) ................... 2014-193435

(51) Int. Cl.
*H01L 21/02* (2006.01)
*H01L 21/3065* (2006.01)
(Continued)

(52) U.S. Cl.
CPC .......... *H01L 21/02076* (2013.01); *B08B 5/00* (2013.01); *B08B 9/00* (2013.01);
(Continued)

(58) Field of Classification Search
None
See application file for complete search history.

(56) References Cited

U.S. PATENT DOCUMENTS

| | | | |
|---|---|---|---|
| 3,378,337 A | 4/1968 | Bach et al. | |
| 5,213,622 A * | 5/1993 | Bohling | C11D 7/02 134/3 |

(Continued)

FOREIGN PATENT DOCUMENTS

| | | |
|---|---|---|
| CN | 1998097 A | 7/2007 |
| JP | H08-213364 A | 8/1996 |

(Continued)

OTHER PUBLICATIONS

Written Opinion of the International Search Authority dated Nov. 10, 2015 for PCT Application No. PCT/JP2015/075368.
(Continued)

*Primary Examiner* — Jiong-Ping Lu
(74) *Attorney, Agent, or Firm* — Hauptman Ham, LLP

(57) ABSTRACT

An etching fault is suppressed by use of an etching gas containing iodine heptafluoride. Provided is an attached substance removing method of removing an attached substance containing an iodine oxide attached to a component included in a chamber or a surface of a pipe connected with the chamber by use of a cleaning gas containing a fluorine-containing gas. Also provided is a dry etching method, including the steps of supplying an etching gas containing an iodine-containing gas into a chamber to perform etching on a surface of a substrate; and after the etching is performed on the surface of the substrate, removing an attached substance containing an iodine oxide attached to a component included in the chamber or a surface of a pipe connected with the chamber by use of a cleaning gas containing a fluorine-containing gas.

21 Claims, 13 Drawing Sheets

(51) Int. Cl.

| | |
|---|---|
| *B08B 5/00* | (2006.01) |
| *B08B 9/00* | (2006.01) |
| *H01L 21/306* | (2006.01) |
| *H01L 21/311* | (2006.01) |
| *H01L 21/3213* | (2006.01) |
| *H01L 21/67* | (2006.01) |
| *H01L 31/18* | (2006.01) |

(52) U.S. Cl.
CPC .. *H01L 21/02046* (2013.01); *H01L 21/02049* (2013.01); *H01L 21/3065* (2013.01); *H01L 21/30604* (2013.01); *H01L 21/31116* (2013.01); *H01L 21/32135* (2013.01); *H01L 21/67017* (2013.01); *H01L 21/67069* (2013.01); *H01L 31/18* (2013.01)

(56) References Cited

U.S. PATENT DOCUMENTS

| | | |
|---|---|---|
| 5,652,171 A | 7/1997 | Nagano et al. |
| 2001/0008227 A1 | 7/2001 | Sadamoto et al. |
| 2004/0231695 A1 | 11/2004 | Ohno et al. |
| 2005/0019977 A1 | 1/2005 | Prakash |
| 2006/0140836 A1 | 6/2006 | Oka |
| 2008/0038929 A1 | 2/2008 | Chang |
| 2016/0005612 A1 | 1/2016 | Kikuchi et al. |

FOREIGN PATENT DOCUMENTS

| | | | |
|---|---|---|---|
| JP | H11-343584 A | | 12/1999 |
| JP | 2000-058515 A | | 2/2000 |
| JP | 2000-159505 A | | 6/2000 |
| JP | 2004-249285 A | | 9/2004 |
| JP | 2008-177209 | * | 7/2008 |
| JP | 2008-177209 A | | 7/2008 |
| JP | 2011-208193 A | | 10/2011 |
| JP | 4999400 B2 | | 8/2012 |
| JP | 2013-46001 A | | 3/2013 |
| JP | 2014-150169 A | | 8/2014 |
| KR | 10-0185489 B1 | | 4/1999 |
| KR | 10-2004-0065154 A | | 7/2004 |

OTHER PUBLICATIONS

Japanese Office Action dated Jun. 20, 2017 for corresponding Japanese Application No. 2014-193435 with partial translation.

Taiwanese Office Action dated Dec. 14, 2016 for corresponding Taiwanese Application No. 105108693.

International Search Report with translation dated Nov. 10, 2015 for PCT Application No. PCT/JP2015/075368.

Donald A. Palmer et al., "The Hydrolysis of Iodine", Journal of Nuclear Materials, 130 (1985), pp. 280-286, Elsevier Science Publishers, North-Holland. Cited in NPL No. 3.

Z. Calahorra, et al., "Reactive Ion Etching of Indium-Tin-Oxide Films", J Electrochem. Soc., vol. 136, No. 6 (1989), pp. 1839-1840, The Electrochemical Society, Inc. Cited in NPL No. 3.

Korean Office Action dated Mar. 15, 2018 for the corresponding Korean application No. 10-2017-7001588, citing above reference with partial English translation.

Notice of Reasons for Revocation of a Patent dated Jun. 15, 2018 for the corresponding Japanese Patent No. 6210039 with partial English translation.

Korean Office Action dated Sep. 17, 2018 for the corresponding Korean application No. 10-2017-7001588, with partial English translation.

* cited by examiner

METHOD FOR REMOVING ADHERING MATTER AND DRY ETCHING METHOD

CROSS-REFERENCE TO RELATED APPLICATIONS

This application is based upon and claims the benefit of priority from the prior Japanese Patent Application No. 2014-193435, filed on Sep. 24, 2014, and PCT Application No. PCT/JP2015/075368, filed on Sep. 7, 2015, the entire contents of which are incorporated herein by reference.

FIELD

The present invention relates to, for example, a method for removing an iodine-containing substance such as an iodine oxide, an iodine compound or the like attached to the inside of a chamber or a gas discharge pipe.

BACKGROUND

A silicon compound is an important and indispensable material in the semiconductor field. For example, a silicon oxide film is used as a gate insulating film of a semiconductor element, and an amorphous silicon film, a silicon nitride film or the like is used as a thin film transistor of a semiconductor element. In addition, a polycrystalline silicon material is used for a three-dimensional structural element such as an MEMS or the like, and silicon carbide (SiC) is used for a low power consumption transistor or the like. In this manner, a silicon compound is used widely. Especially, a semiconductor element such as a transistor or the like included in a DRAM or a flash memory is highly integrated progressively, and thus a silicon semiconductor device is a target of attention.

Usually in a semiconductor production process, silicon or a silicon compound is processed into a predetermined shape or removed in a predetermined step such as a final step or the like. For processing or removing a silicon compound in this manner, dry etching is conventionally used widely.

The present inventors found that use of iodine heptafluoride for an etching material realized selective etching of silicon (see Japanese Laid-Open Patent Publication No. 2014-150169). However, in the case where this technique is used for etching in the state where moisture is contained in a chamber or a gas discharge pipe, an iodine oxide represented by chemical formula $I_xO_yF_z$ (x represents an integer of 1 or 2, y represents an integer of 1 or greater and 5 or less, and z represents an integer of 0 or 1) may be generated by the following reaction and attached to the inside of the chamber or a wall of the gas discharge pipe.

Reaction expression: 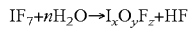

$$IF_7 + nH_2O \rightarrow I_xO_yF_z + HF$$

The reaction for etching a silicon thin film on a substrate by use of iodine heptafluoride is represented by the following expression.

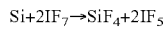

$$Si + 2IF_7 \rightarrow SiF_4 + 2IF_5$$

At the time of etching, a by-product or an iodine compound such as iodine pentafluoride ($IF_5$) or the like may be attached to the inside of the chamber or the wall of the gas discharge pipe, or deposited on a surface of the substrate, by decomposition of etching gas.

When a substrate such as an Si wafer or the like is introduced into the chamber in the state where an iodine oxide or an iodine compound (hereinafter, an iodine oxide and an iodine compound may be collectively referred to as a "iodine-containing substance") is attached to the inside of the chamber or the wall of the gas discharge pipe, the iodine-containing substance that is volatized when the inside of the chamber is made vacuum and the internal atmosphere of the chamber is replaced with an inert gas is attached to the substrate such as the Si wafer or the like. There is a problem that an inconvenience such that, for example, the etching rate is decreased or the etching does not proceed properly by the influence of the iodine-containing substance attached to the substrate.

If the iodine compound generated at the time of etching is kept deposited to the surface of the substrate, the surface of the substrate is kept contaminated with iodine. If the surface of the substrate is exposed to the air in this state, the iodine compound reacts with moisture in the air to generate hydrogen iodide (HI), iodic acid ($HIO_3$) or the like. This causes a problem of possibly inducing corrosion of a metal component in the chamber, the gas discharge pipe or the like.

Japanese Laid-Open Patent Publication No. 2013-46001 discloses the following etching method using iodine heptafluoride. A reactive gas (interhalogen compound or hydrogen fluoride) and an inert gas are mixed together and jetted into the chamber while a gas supply path to the chamber is cooled and heat-insulated to be expanded. Thus, reactive clusters are generated in the chamber and used to perform etching and cleaning. The method of Japanese Laid-Open Patent Publication No. 2013-46001 puts the reactive gas into clusters to increase the etching rate.

Japanese Laid-Open Patent Publication No. 2013-46001 describes the interhalogen gas and HF as the reactive gas, and describes iodine heptafluoride as an example of such a reactive gas. However, Japanese Laid-Open Patent Publication No. 2013-46001 does not describe any iodine-containing substance generated as a by-product or does not disclose any influence of the iodine-containing substance on etching. With the technique of Japanese Laid-Open Patent Publication No. 2013-46001, an iodine oxide is generated by the influence of the moisture in the chamber or the gas discharge pipe. Therefore, the inconvenience regarding etching is not suppressed, and the object of suppressing the inconvenience caused at the time etching and improving the productivity is not achieved.

Japanese Laid-Open Patent Publication No. 2011-208193 discloses a method of cleaning a vacuum gas discharge pipe, more specifically, a method of using an interhalogen compound to clean a suction pipe related to a semiconductor film production device and a vacuum pump. Japanese Laid-Open Patent Publication No. 2011-208193 describes iodine heptafluoride as a reactive gas. However, Japanese Laid-Open Patent Publication No. 2011-208193 does not describe any iodine-containing substance generated as a by-product or does not disclose any influence of the iodine-containing substance on etching. In Japanese Laid-Open Patent Publication No. 2011-208193, a deposited film of amorphous silicon, silicon dioxide or a dopant is removed by cleaning, but an iodine-containing substance derived from a reactive gas is not described.

Japanese Patent No. 4999400 discloses the following method for dry-etching an oxide semiconductor film. An oxide semiconductor film containing In, Ga and Zn is etched by use of $Cl_2$ or $Cl_2/Ar$ under the following conditions (chamber pressure: 0.06 Pa or greater and 5 Pa or less; and density of the bias RF power applied to the substrate side: 0.02 W/cm$^2$ or greater). It is described that this method suppresses the end of a pattern of the vapor-deposited film from being turned up when the photoresist is removed and thus improves the yield as compared with a conventional lift-off method. However, the film to be removed by the method of Japanese Patent No. 4999400 is an oxide semiconductor film containing In, Ga and Zn, and Japanese Patent No. 4999400 does not describe removal of an iodine-containing substance. In addition, if an iodine-containing substance is removed under the conditions of Japanese Patent No. 4999400, an Al-based material, which is a component of an etching device, is corroded. This is not preferable.

As described above, there is no document that describes generation of an iodine oxide caused by moisture in a chamber or a gas discharge pipe, and the problem that the generation of an iodine oxide causes an inconvenience regarding etching and decreases the productivity is not known. Currently, no measure is known against the inconvenience regarding etching that is caused by an iodine-containing substance encompassing an iodine oxide and also an iodine compound generated at the time of etching. There is a problem that the chamber needs to be disassembled and cleaned in order to remove such an iodine-containing substance.

The present invention made in light of the above-described problems has an object of suppressing an inconvenience at the time of etching performed by use of an etching gas containing iodine heptafluoride or the like.

SUMMARY

An embodiment according to the present invention is directed to an attached substance removing method of removing an attached substance containing an iodine oxide attached to a surface of a component included in a chamber or a surface of a pipe connected with the chamber by use of a cleaning gas containing a fluorine-containing gas.

Another embodiment according to the present invention is directed to a dry etching method, including the steps of supplying an etching gas containing an iodine-containing gas into a chamber and performing etching on a surface of a substrate, and after the etching is performed on the surface of the substrate, removing an attached substance containing an iodine oxide attached to a surface of a component included in the chamber or a surface of a pipe connected with the chamber by use of a cleaning gas containing a fluorine-containing gas.

Still another embodiment according to the present invention is directed to an attached substance removing method of removing an attached substance containing an iodine compound attached to a surface of a component included in a chamber or a surface of a pipe connected with the chamber by use of a cleaning gas containing a fluorine-containing gas not containing iodine.

Still another embodiment according to the present invention is directed to a dry etching method, including an etching step of removing a film on a substrate with an etching gas containing an iodine-containing gas, and a post-process step of removing an iodine compound generated in the etching step. In the post-process step, a post-process gas containing a fluorine-containing gas not containing iodine is supplied to a surface of the substrate to remove the iodine compound.

Still another embodiment according to the present invention is directed to a substrate processing device, including a chamber accommodating a substrate having a silicon-containing film, containing at least silicon as a main component, formed thereon, an etching gas supply portion supplying an etching gas containing an iodine-containing gas into the chamber, a cleaning gas supply portion supplying a cleaning gas containing a fluorine-containing gas into the chamber, and a device controller controlling at least the etching gas supply portion and the cleaning gas supply portion, and after supplying the etching gas to perform etching on the substrate, removing an attached substance containing an iodine oxide attached to the inside of the chamber by use of the cleaning gas.

Still another embodiment according to the present invention is directed to a substrate processing device, including a chamber accommodating a substrate having a silicon-containing film, containing at least silicon as a main component, formed thereon, an etching gas supply portion supplying an etching gas containing an iodine-containing gas into the chamber, a post-process gas supply portion supplying a post-process gas containing a fluorine-containing gas into the chamber, and a control portion controlling at least the etching gas supply portion and the post-process gas supply portion such that the etching gas is supplied into the chamber to expose the substrate to the etching gas to remove the silicon-containing film, and then the post-process gas is supplied into the chamber to remove an iodine compound deposited on the substrate.

REFERENCE SIGNS LIST

1 . . . Etching device, 2 . . . Chamber, 3 . . . Sample, 4 . . . Stage, 5 . . . Pressure meter, 6 . . . Etching gas supply system, 7 . . . Valve, 8 . . . Cleaning gas supply system, 9 . . . Valve, 10 . . . Inert gas supply system, 11 . . . Valve, 12 . . . Gas discharge pipe, 13 . . . Valve, 14 . . . Pressure controller, 15 . . . Vacuum pump, 16 . . . Temperature controller (temperature adjuster), 17 . . . Device controller, 21 . . . Thermogravimetry-differential thermal analysis device, 22 . . . Test sample, 23 . . . Reference sample, 24 . . . Thermocouple, 25 . . . Scale unit, 26 . . . Gas introduction opening, 27 . . . Gas discharge opening, 28 . . . Heater, 50 . . . Processing chamber, 100 . . . Etching device, 101 . . . Substrate, 102 . . . Susceptor, 130 . . . Chamber (processing container), 142 . . . Gas discharge pipe, 500 . . . Controller

DESCRIPTION OF EMBODIMENTS (Embodiment 1)

Hereinafter, embodiments of the present invention will be described in detail.

Embodiment 1 according to the present invention is regarding an attached substance cleaning method using a cleaning gas containing a fluorine-containing gas for removing an attached substance containing an iodine oxide that is attached to a surface of a component included in a chamber or a surface of a pipe connected to the chamber.

The iodine oxide is preferably expressed by chemical formula [$I_xO_yF_z$ (x represents an integer of 1 or 2, y represents an integer of 1 or greater and 5 or less, and z represents an integer of 0 or 1). $I_2O_5$ is most stable among the iodine oxides expressed by this chemical formula. If $I_2O_5$ is removed, the other iodine oxides are removed highly possibly. The attached substance may contain a plurality of types of iodine oxides having different compositions among the iodine oxides expressed by $I_xO_yF_z$.

The fluorine-containing gas contained in the cleaning gas is preferably at least one selected from the group consisting of HF, $F_2$, $XF_n$ (X represents any one of Cl, Br and I; and n represents an integer of 1 or greater and 7 or less). Examples of the usable fluorine-containing gas include HF, $F_2$, ClF, $ClF_3$, $ClF_5$, BrF, $BrF_3$, $BrF_5$, IF, $IF_3$, $IF_5$, and $IF_7$.

The cleaning gas is put into contact with the iodine oxide in a temperature range of, preferably, 20° C. or higher and 300° C. or lower, more preferably, 40° C. or higher and 200° C. or lower. It is not preferable to raise the temperature of the cleaning gas to too high a level because the cleaning gas at such a high temperature is reactive with the metal component of stainless steel or the like in the chamber or the gas discharge pipe. It is not preferable to lower the reaction temperature to too low a level because at such a low temperature, the reaction of the cleaning gas and the iodine oxide does not proceed. In this case, the attached substance is not removed, or it takes a long time to remove the attached substance.

Figure 3:
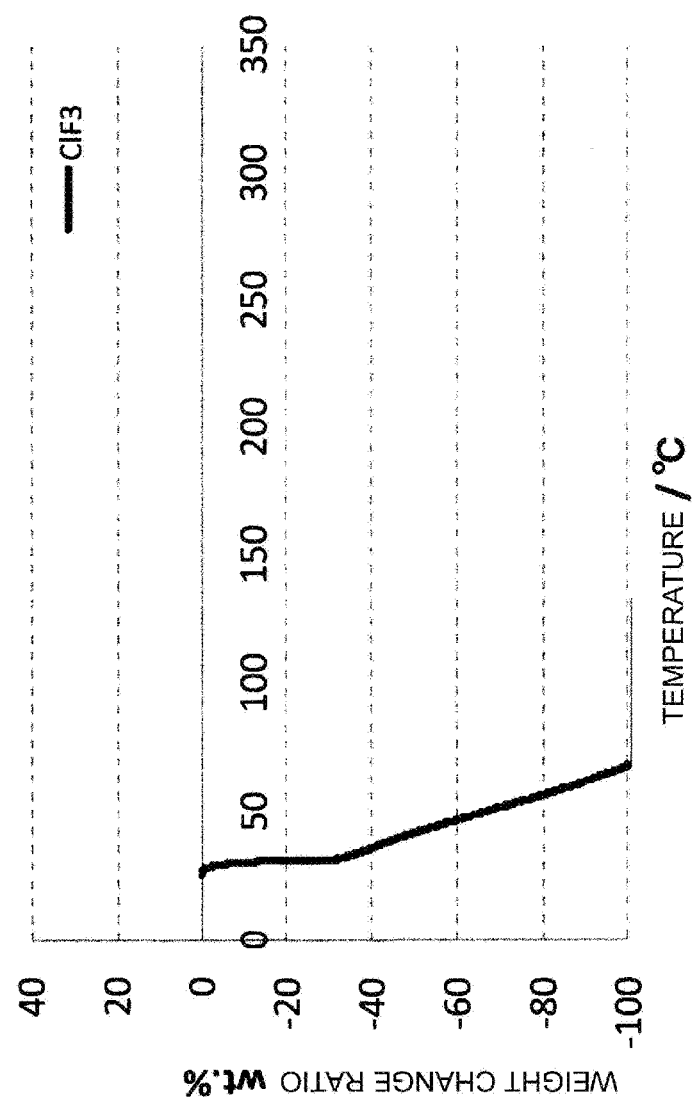
FIG. 3 shows the temperature dependence of the weight change while $ClF_3$ gas flows in a reactivity examination on $I_2O_5$.

It is especially preferable that the fluorine-containing gas contained in the cleaning gas is at least one selected from the group consisting of $F_2$, $ClF_3$ and $IF_7$. As shown in FIG. 3, it has been found in a reactivity examination described below that $ClF_3$ is reactive with $I_2O_5$ at a temperature of 25° C. or higher at 760 Torr (=101 kPa). Therefore, in the case where the cleaning gas contains $ClF_3$, it is preferable to put the cleaning gas into contact with the iodine oxide in a temperature range of 25° C. or higher and 200° C. or lower. When the temperature exceeds 200° C., the reactivity of $ClF_3$ and stainless steel is made high, which increases the possibility that the inside of the chamber or the gas discharge pipe is corroded. In the case where the cleaning gas contains $ClF_3$, the iodine oxide is removed even at a low temperature. As shown in FIG. 3, the weight of $I_2O_5$ starts changing at 25° C., and the reaction of $I_2O_5$ and $ClF_3$ is completely finished at 75° C. This result shows that a high reaction rate is achieved in a short heating time. Therefore, it is especially preferable that the temperature range is 40° C. or higher and 75° C. or lower.

Figure 4:
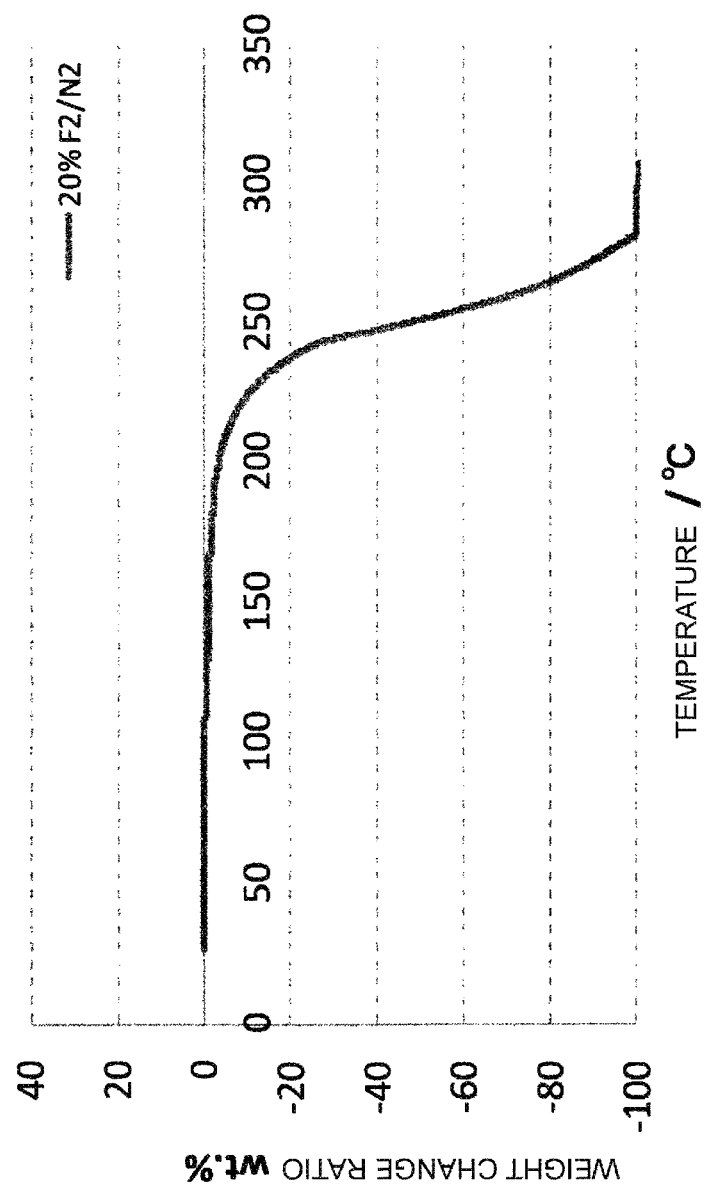
FIG. 4 shows the temperature dependence of the weight change while 20% $F_2/N_2$ gas flows in a reactivity examination on $I_2O_5$.

As shown in FIG. 4, it has been found in a reactivity examination (described below), performed by use of nitrogen dilution gas containing 20% by volume of $F_2$, that $F_2$ is reactive with $I_2O_5$ at a temperature of 120° C. or higher at 760 Torr (=101 kPa). Therefore, in the case where the cleaning gas contains $F_2$, it is preferable to put the cleaning gas into contact with the iodine oxide in a temperature range of 120° C. or higher and 200° C. or lower. When the temperature exceeds 200° C., the reactivity of $F_2$ and stainless steel is made high, which increases the possibility that the inside of the chamber is corroded. In the case where the cleaning gas contains $F_2$, the iodine oxide is removed even at a relatively low temperature.

Figure 5:
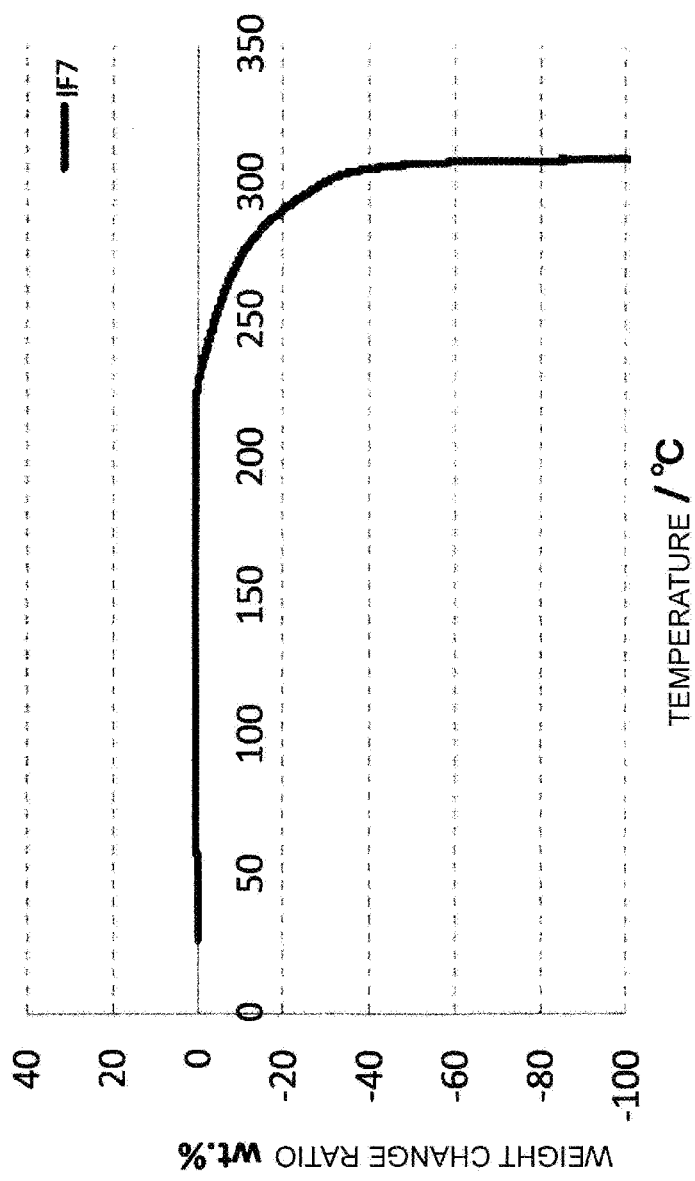
FIG. 5 shows the temperature dependence of the weight change while $IF_7$ gas flows in a reactivity examination on $I_2O_5$.

As shown in FIG. 5, it has been found in a reactivity examination described below that $IF_7$ is reactive with $I_2O_5$ at a temperature of 230° C. or higher at 760 Torr (=101 kPa). Therefore, in the case where the cleaning gas contains $IF_7$, it is preferable to put the cleaning gas into contact with the iodine oxide in a temperature range of 230° C. or higher and 300° C. or lower. When the temperature of $IF_7$ exceeds 300° C., $IF_7$ is easily decomposed into $IF_5$ and $F_2$, which especially increases the possibility that $F_2$ reacts with stainless steel and corrodes the inside of the chamber or the gas discharge pipe.

The cleaning gas is put into contact with the iodine oxide at a pressure range of, preferably, 66 Pa or higher and 101 kPa or lower, more preferably, 66 Pa or higher and 40 kPa or lower. When the pressure is too high, an etching device, which is configured to be used at a reduced pressure, may cause an inconvenience. By contrast, when the pressure is too low, the reaction does not proceed. In this case, the attached substance is not easily removed, or it takes an excessively long time to remove the attached substance.

The cleaning gas merely needs to contain the fluorine-containing gas in a sufficient amount to remove the iodine oxide. The fluorine-containing gas is contained preferably at 5% by volume or greater, more preferably at 20% by volume or greater, and especially preferably at 90% by volume or greater. It is specifically preferable that the fluorine-containing gas is contained substantially at 100% by volume, namely, that substantially no gas other than the fluorine-containing gas is contained.

In embodiment 1, the iodine oxide in the chamber or the gas discharge pipe is removed by introduction of the cleaning gas with no need to disassemble the chamber for cleaning, and thus a dry etching method using iodine heptafluoride is performed efficiently.

(Embodiment 2)

Embodiment 2 according to the present invention is regarding a dry etching method including a step of etching a surface of a substrate and a step of removing the attached substance.

The dry etching method in embodiment 2 includes an etching step of supplying an etching gas containing an iodine-containing gas into the chamber and etching the surface of the substrate, and an attached substance removal step of, after the etching is performed on the surface of the substrate, removing the attached substance that contains the iodine oxide and is attached to the inside of the chamber by use of a cleaning gas containing at least a fluorine-containing gas.

In the case where the cleaning gas contains fluorine or iodine heptafluoride, it is preferable to heat the inside of the chamber and the gas discharge pipe in order to efficiently remove the attached substance containing the iodine oxide. In the case where the cleaning gas contains $ClF_3$, the iodine oxide is removed even at a low temperature. For example, the etching with iodine heptafluoride and the removal of the attached substance with $ClF_3$ may be performed at about the same temperature. Therefore, the use of $ClF_3$ as the cleaning gas is preferable especially because the load on the device is decreased, which contributes to improvement of the throughput.

In embodiment 2, it is not necessary to perform the attached substance removal step each time the etching step is performed. The attached substance removal step may be performed after the etching step is performed a plurality of times. Decrease in the number of times of the attached substance removal step improves the efficiency of use of the device.

The attached substance removal step may be performed in substantially the same manner as in embodiment 1. In the case where the cleaning gas containing $IF_7$ is used in the attached substance removal step in order to remove, in the attached substance removal step, the iodine oxide not reacted in the etching step, it is preferable to perform the attached substance removal step at a temperature or a pressure higher than that of the etching step.

(Etching Step)

In the etching step, the etching gas containing the iodine-containing gas is introduced into the chamber to perform etching on the surface of the substrate. The iodine-containing gas is especially preferably iodine heptafluoride, which selectively etches silicon. For the etching step, it is not indispensable to add gas to iodine heptafluoride. Iodine heptafluoride is usable independently. Another gas may be added as necessary in a range that does not spoil the effect of the etching step. Usually, iodine heptafluoride is contained in the etching gas at 50% by volume or greater, preferably 80% by volume or greater. It is specifically preferable that iodine heptafluoride is contained substantially at 100% by volume, namely, that substantially no gas other than iodine heptafluoride is contained, in order to provide both of a high in-plane uniformity and a high etching rate.

The expression that "substantially no gas other than iodine heptafluoride is contained" indicates that no component other than iodine heptafluoride is separately added for use for etching. A trace amount of iodine pentafluoride, fluorine, hydrogen fluoride or the like derived from a material unavoidably mixed in a general step of producing iodine heptafluoride may be contained.

An oxidative gas or an inert gas may be incorporated into the etching gas as necessary in addition to iodine heptafluoride in order to adjust the performance of the etching gas. Usually in the case where such a gas is added, the content of iodine heptafluoride is appropriately adjusted to be 1% by volume or greater and 100% by volume or less.

Examples of the oxidative gas include oxygen-containing gas such as $O_2$, $O_3$, $CO_2$, $N_2O$, NO, $NO_2$ or the like; and halogen gas such as $F_2$, $NF_3$, $Cl_2$, $Br_2$, $I_2$, $YF_n$ (Y is any one of Cl, Br and I, and n is an integer of 1 or greater and 5 or less), or the like. Among these types of gas, $O_2$, $F_2$, $NF_3$ and $Cl_2$ are preferable because of the easy availability thereof and the stability thereof when being mixed with iodine heptafluoride. The amount of the oxidative gas is appropriately adjusted in accordance with the performance and the shape of the etching device to be used and the etching conditions.

It has been found that iodine heptafluoride, for the chemical properties thereof, is highly superior, to an existing etching gas for silicon, in the etching selection ratio with respect to an anti-etching member such as a mask member or the like used to etch silicon for processing. The "anti-etching member" is a member having a significantly lower reactivity with an etching gas containing iodine heptafluoride used in this embodiment than with respect to an existing etching as for silicon.

The dry etching in embodiment 2 is usable for any silicon material with no specific limitation. The dry etching in embodiment 2 is usable for, for example, amorphous silicon, polycrystalline silicon, single crystalline silicon and the like. The dry etching in embodiment 2 is preferably usable for a surface of a substrate including a silicon film and for a structural body of a semiconductor element including at least a silicon film and an anti-etching member that is highly unreactive with iodine heptafluoride. The dry etching in embodiment 2 is also usable for an item formed of only silicon, and is usable for surface processing on a surface of a silicon substrate. The dry etching in embodiment 2 is usable for, for example, forming a trench or a hole in a silicon substrate.

The "silicon film" is preferably a silicon film used for forming a semiconductor element, for example, an amorphous silicon film, a polycrystalline silicon film, a single crystalline silicon film or the like. The anti-etching member is usable as a mask for processing a silicon into a predetermine shape. Alternatively, the anti-etching member is usable for removing a silicon film to form the anti-etching member itself into a predetermine shape such as a shape of a three-dimensional structure or the like, so that the anti-etching member is used as a structural body of a semiconductor element.

In the case where the anti-etching member is used as a mask, the following etching method is usable. A mask patterned into a predetermined shape is put on a surface of a silicon film, and the etching gas is used to selectively etch the silicon film. There is no specific limitation on the material used for the mask as long as the material is significantly unreactive with iodine heptafluoride. Examples of the usable material include $SiO_2$; SiOC; SiON; SiN; TiN; $TiO_2$; photoresist; carbon-based materials; metal materials such as Ru, Cu, Ni, Co, Hf, Zr, and oxides thereof. Among these materials, $SiO_2$, SiN, TiN and the like are especially preferable.

In the case where the anti-etching member itself is used as a structural body of a semiconductor element, a material significantly unreactive with iodine heptafluoride is used for the anti-etching member. At least one selected from the group consisting of $SiO_2$, SiN and TiN is preferably usable.

Now, the reaction conditions for the etching step in embodiment 2 will be described.

The process pressure in the chamber when the etching gas is put into contact with the silicon film is 0.1 Pa or higher and 101 kPa or lower, preferably 0.1 Pa or higher and 10 kPa or lower, and more preferably 10 Pa or higher and 500 Pa or lower.

The substrate temperature when the etching gas is put into contact with the silicon film, which is to be processed, is usually −40° C. or higher and 150° C. or lower, preferably 20° C. or higher and 90° C. or lower, and more preferably 30° C. or higher and 50° C. or lower in order to provide a high in-plane uniformity regarding the etching rate.

There is no specific limitation on the etching time. In consideration of the efficiency of the semiconductor device production process, the etching time is preferably 60 minutes or shorter. The "etching time" is the time duration from when the etching gas is introduced into the processing chamber in which the substrate, as a target of the etching, is located, until the etching gas in the processing chamber is discharged via a vacuum pump or the like in order to finish the etching. The substrate may be a substrate having a silicon surface or a substrate having, on a surface thereof, a structural body such as a semiconductor element or the like including at least silicon and a member more unreactive with iodine heptafluoride than silicon.

Figure 1:
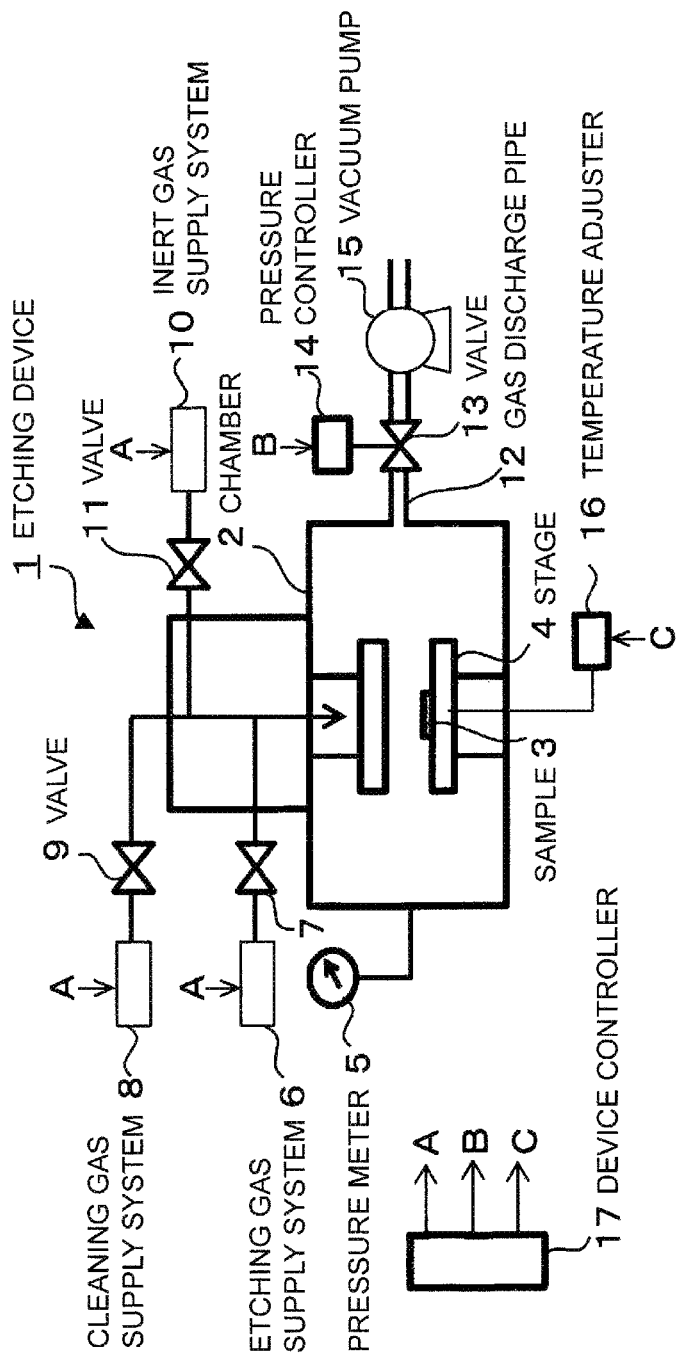
FIG. 1 is a schematic view of an etching device 1 used in embodiment 1 and embodiment 2.

The dry etching method in embodiment 2 may be performed by use of a general etching device usable for a semiconductor production process as shown in FIG. 1. There is no specific limitation on the structure of the etching device to be used for the dry etching method in embodiment 2. There is no specific limitation on the positional relationship between a gas supply pipe and an item to be processed, for example, a semiconductor element located in the chamber.

There is no specific limitation on the chamber in which the etching process is to be performed, as long as the chamber is tolerant to the fluorine-based gas to be used and the inner pressure thereof may be decreased to a predetermined level. Usually, a general chamber included in an etching device for a semiconductor is used. There is no specific limitation on the supply pipe for maintaining iodine heptafluoride at a predetermined pressure and supplying iodine heptafluoride, or on other pipes, as long as the pipes are tolerant to the fluorine-based gas. General pipes are usable.

[Example 1]

Hereinafter, mainly embodiment 1 and embodiment 2 according to the present invention will be mainly described by way of example 1. The present invention is not limited to example 1.

[Reactivity Examination]

The reactivity of $I_2O_5$ was examined. $I_2O_5$ is most stable among $I_xO_yF_z$ (x represents an integer of 1 or 2, y represents an integer of 1 or greater and 5 or less, and z represents an integer of 0 or 1).

Figure 2:
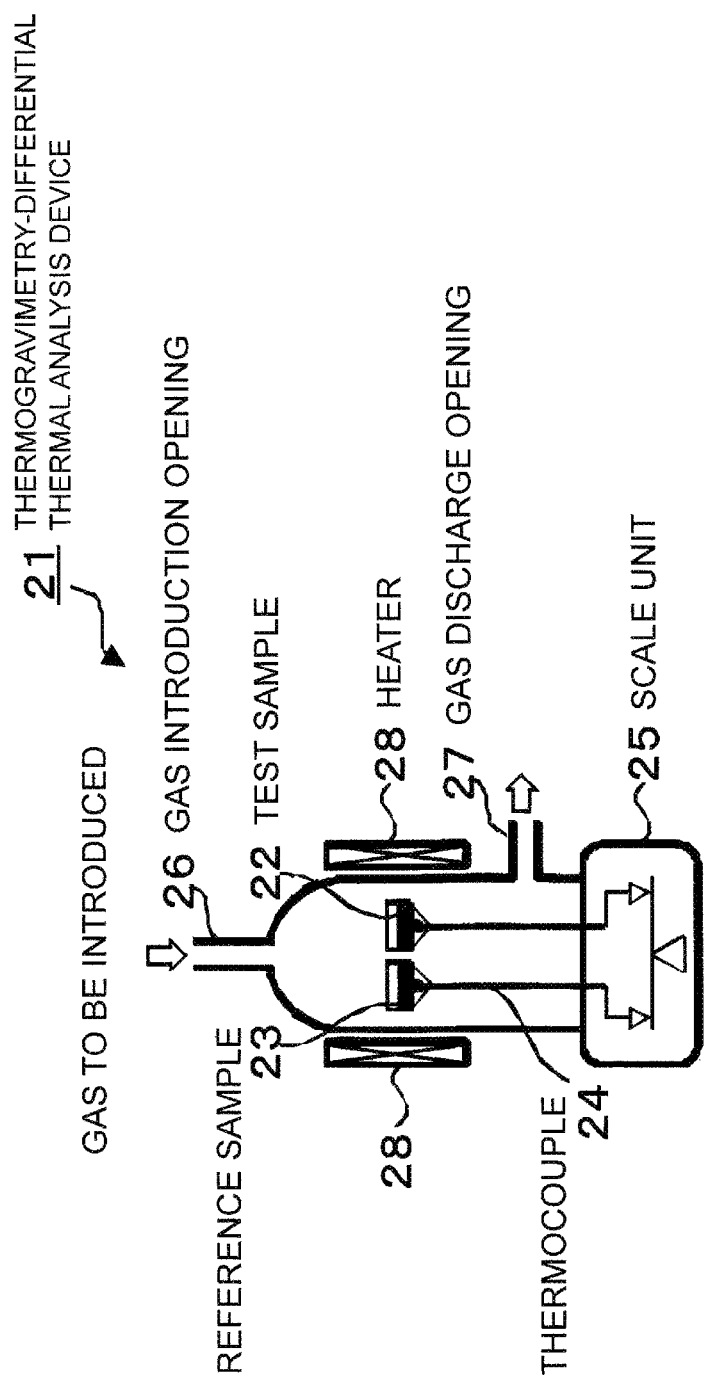
FIG. 2 is a schematic view of a thermogravimetry-differential thermal analysis device 21.

$I_2O_5$ was weighed as test sample 22 and $Al_2O_3$ was weighed as reference sample 23, and $I_2O_5$ and $Al_2O_3$ were set on a sample stage in a thermogravimetry-differential thermal analysis device shown in FIG. 2. The stage temperature was raised while gas was supplied to flow under the following conditions to measure the changes in the temperature and the weight of each of the samples in accordance with the stage temperature. FIG. 3 through FIG. 5 show the temperature dependence of the change in the weight under the flow of different types of reactive gas in the reactivity examination on $I_2O_5$. Table 1 shows the reaction start temperature under the flow of each type of reactive gas.

Reactive gas: $ClF_3$, 20% $F_2/N_2$, $IF_7$, or $O_2$
Gas flow rate: 20 sccm (standard cubic centimeter per minute)
Stage temperature: room temperature→300° C. (temperature increase rate: 3° C./min.)
Process pressure: 760 torr (=101 kPa)

As a result of the examination, it has been confirmed that as shown in Table 1, $I_2O_5$ is most reactive with $ClF_3$ and does not react with $O_2$ even at 300° C.

TABLE 1

| Type of reactive gas | $ClF_3$ | 20%$F_2/N_2$ | $IF_7$ | $O_2$ |
|---|---|---|---|---|
| Reaction start temperature [° C.] | 25 | 120 | 230 | — |

The thermogravimetry-differential thermal analysis device 21 shown in FIG. 2 measures the change in the weight of the test sample 22 and the reference sample 23 by a scale unit 25 while measuring the temperature thereof by a thermocouple 24. For the measurement, gas is introduced from a gas introduction opening 26 and is discharged from a discharge opening 27. While the test sample 22 and the reference sample 23 are heated by a heater 28, the differential heat and the thermogravity are measured at the same time.

[Example 1/Comparative Example 1]

In order to check the effect provided by the attached substance removal step, example 1 of repeating the attached substance removal step and the etching step and comparative example 1 of repeating the etching step without performing the attached substance removal step were performed. FIG. 1 is a schematic view of an etching device 1 used for example 1. Unlike in comparative example 1, in example 1, a device controller 17 is used. The device controller 17 executes a control program including the attached substance removal step in addition to the etching step (hereinafter, this control program may be referred to as a "first control program"). The device controller as a control unit executes the first control program to realize a flow shown in FIG. 6 described below including the etching step and the attached substance removal step.

The etching device 1 includes a chamber 2, in which the etching step and the attached substance removal step are performed. The chamber 2 accommodates a stage 4 supporting a sample 3. The sample 3 includes a silicon substrate, a silicon oxide film (20 nm) formed thereon, and a polycrystalline silicon film (30 μm) formed thereon. The stage 4 is provided with a stage temperature adjuster 16 capable of adjusting the temperature of the stage.

The chamber 2 is connected with an etching gas supply system 6, a cleaning gas supply system 8 and an inert gas supply system 10 respectively via valves 7, 9 and 11. The chamber 2 is provided with a gas discharge pipe 12 usable to discharge gas in the chamber to outside. The gas discharge pipe 12 is connected with a vacuum pump 15 via a valve 13. The pressure in the chamber 2 is controlled by a pressure controller 14 controlling the valve 13. The device controller 17 is connected with the etching gas supply system 6, the cleaning gas supply system 8, the inert gas supply system 10, the pressure controller 14, the temperature adjuster 16 and the like, and is capable of controlling these components.

Figure 6:
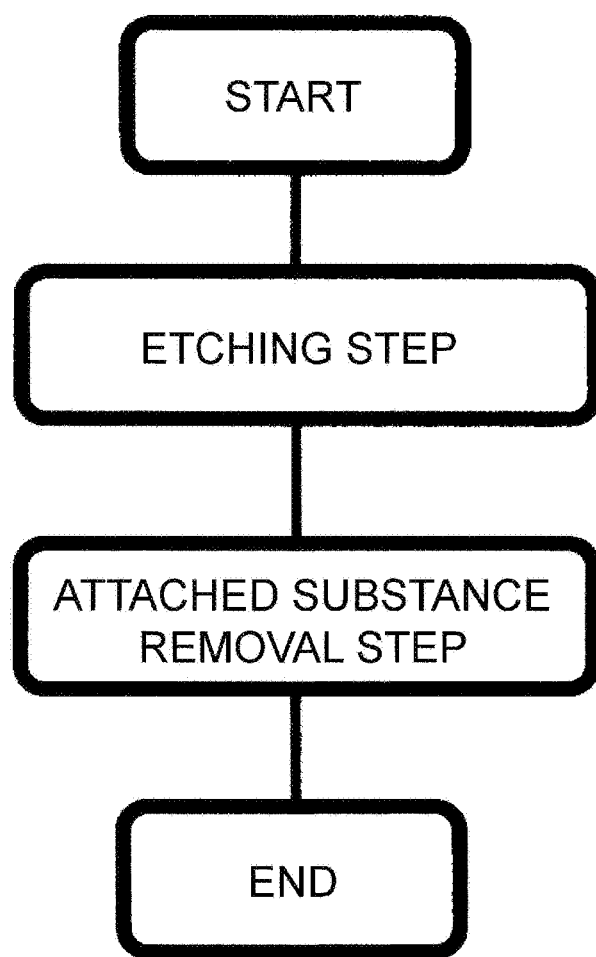
FIG. 6 shows a dry etching process performed by use of an etching device in embodiment 1 and embodiment 2.

Now, with reference to FIG. 6, the etching step and the attached substance removal step (cleaning step) will be described. First, how the etching device 1 was used in the etching step will be described. First, the sample 3 was set on the stage 4. After the pressure in the chamber 2 was decreased to less than 1 Pa, the temperature of the stage 4 was made 50° C. Then, the valve 7 was opened to supply iodine heptafluoride as the etching gas from the etching gas supply system 6 into the chamber 2 at a pressure of 101 kPa. The flow rate of the etching gas in this step was 100 sccm, and the process pressure was 200 torr (=26.7 kPa). Two minutes after the etching gas was introduced, the introduction of the etching gas was stopped. The inside of the chamber 2 was made vacuum, and the internal atmosphere of the chamber was replaced with an inert gas. Then, the sample 3 was removed.

How the etching device 1 was used in the attached substance removal step will be described. After the sample 3 was removed from the chamber 2, the pressure in the chamber 2 was decreased to less than 1 Pa. Then, the temperature of the stage 4 and the chamber 2 was made 50° C. Then, the valve 9 was opened to supply $ClF_3$ as the cleaning gas from the cleaning gas supply system 8 into the chamber 2 and the gas discharge pipe. The flow rate of the cleaning gas in this step was 100 sccm, and the process pressure was 300 torr (=40.0 kPa). Two minutes after the cleaning gas was introduced, the introduction of the cleaning gas was stopped. The inside of the chamber 2 was made vacuum, and the internal atmosphere of the chamber was replaced with an inert gas.

In example 1, the etching step→the attached substance removal step→the etching step were performed in this order. The etching step was performed 100 times to perform etching on 100 samples 3. In comparative example 1, the etching step→the etching step were performed in this order. The etching step was performed 100 times to perform etching on 100 samples 3.

Figure 7:
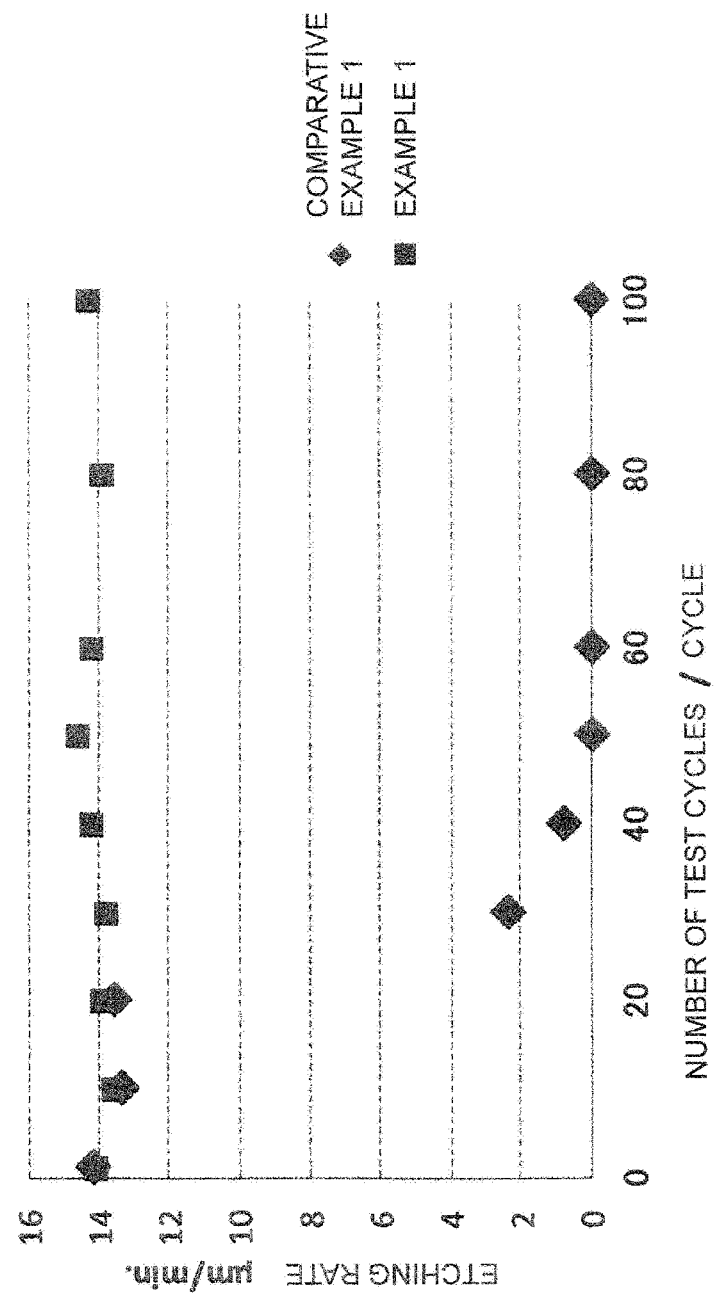
FIG. 7 shows a change in the etching rate when an etching test is repeated in each of example 1 and comparative example 1.

The silicon substrates with the polycrystalline silicon films (samples 3) were used to measure the thickness of the pre-etching polycrystalline silicon films and the post-etching polycrystalline silicon films at a plurality of positions. The amount of etching (thickness difference between the pre-etching film and the post-etching film) was found at each measurement position. The Si etching rate was calculated from the average of the etching amounts at the measurement positions and the etching time. Table 2 shows the Si etching rate in each of etching cycles of example 1 and comparative example 1. FIG. 7 shows the change in the Si etching rate while the etching test was repeated.

TABLE 2

| | Si etching rate [μm/min] | |
|---|---|---|
| Cycle | Example 1 | Comparative example 1 |
| 1 | 14.1 | 14.2 |
| 10 | 13.6 | 13.4 |
| 20 | 13.9 | 13.6 |
| 30 | 13.8 | 2.4 |
| 40 | 14.2 | 0.8 |
| 50 | 14.6 | 0 |
| 60 | 14.2 | 0 |
| 80 | 13.9 | 0 |
| 100 | 14.3 | 0 |

The results were as follows. In comparative example 1 of repeating only the etching step, the Si etching rate was decreased at the 30th cycle, and the etching did not proceed at the 50th cycle and thereafter. By contrast, in example 1 of performing the attached substance removal step after the etching step, the Si etching rate was not confirmed to be decreased even at the 100th cycle. In example 1, the attached substance removal step was performed, so that the etching step was repeated while the etching rate was maintained with no need to disassemble the chamber for cleaning.

As described above, in the case where only the etching step is repeated, the Si etching rate is decreased after the etching is performed a predetermined number of cycles and an etching fault occurs. In order to solve this problem, the present inventors paid attention to the bonding energy of I-O and I-F (I-O: 174 kJ/mol; I-F: 277.5 kJ/mol). Fluorine-containing gas was caused to act on an iodine oxide attached to the inside of the chamber or the gas discharge pipe, so that the iodine oxide in the chamber or the gas discharge pipe was reacted with the fluorine-containing gas. As a result, gas such as HF, $O_2$, $IF_5$ or the like was generated, and thus the attached substance in the chamber or the gas discharge pipe was efficiently removed. In this manner, in this embodiment, the attached substance in the chamber or the gas discharge pipe is removed by introduction of the cleaning gas with no need to disassemble the chamber for cleaning, and thus a dry etching method using iodine heptafluoride is performed efficiently.

Conventionally, if a substrate such as an Si wafer or the like is introduced into the chamber in the state where an iodine oxide is attached to the inside of the chamber or the wall of the gas discharge pipe, the iodine oxide volatized when the inside of the chamber is made vacuum and the internal atmosphere of the chamber is replaced with an inert gas is attached to the substrate such as the Si wafer or the like. If etching is performed with iodine heptafluoride in this state, there is a problem that an inconvenience such that, for example, the etching rate is decreased or the etching does not proceed properly. In this embodiment, the attached substance removal step (cleaning step) using a cleaning gas containing a fluorine-containing gas is performed, so that the inconvenience regarding the etching is solved. Thus, this embodiment realizes production with no inconvenience regarding the etching, which is caused with the conventional technology, and is expected to increase the productivity.

Embodiment 1 and embodiment 2 provides at least one effect among (a) through (h).

(a) In this embodiment, an iodine oxide in the chamber or the gas discharge pipe is removed by introduction of the cleaning gas with no need to disassemble the chamber for cleaning, and thus a dry etching method using iodine heptafluoride is performed efficiently.

(b) In this embodiment, it is preferable that the cleaning gas is put into contact with an iodine oxide in a temperature range of 20° C. or higher and 300° C. or lower and a pressure range of 66 Pa or higher and 101 kPa or lower. A fluorine-containing gas is caused to act on the iodine oxide in the chamber or the gas discharge pipe under such cleaning conditions, so that the iodine oxide in the chamber or the gas discharge pipe reacts with the fluorine-containing gas. Therefore, the attached substance in the chamber or the gas discharge pipe is efficiently removed.

(c) In this embodiment, in the case where the fluorine-containing gas is $ClF_3$, it is preferable that the temperature range is 25° C. or higher and 200° C. or lower. In the case where the fluorine-containing gas is $F_2$, it is preferable that the temperature range is 120° C. or higher and 200° C. or lower. In the case where the fluorine-containing gas is $IF_7$, it is preferable that the temperature range is 230° C. or higher and 300° C. or lower. Each type of fluorine-containing gas is caused to act on the iodine oxide represented by $I_xO_yF_z$ (x represents an integer of 1 or 2, y represents an integer of 1 or greater and 5 or less, and z represents an integer of 0 or 1) contained in the attached substance in the chamber or the gas discharge pipe under such cleaning conditions, so that the iodine oxide in the chamber or the gas discharge pipe reacts with the fluorine-containing gas. Therefore, the attached substance in the chamber or the gas discharge pipe is efficiently removed.

(d) In the cleaning condition in this embodiment, the fluorine-containing gas reacts with $I_2O_5$, which is most stable among the iodine oxides represented by $I_xO_yF_z$ (x represents an integer of 1 or 2, y represents an integer of 1 or greater and 5 or less, and z represents an integer of 0 or 1) contained in the attached substance in the chamber or the gas discharge pipe. Therefore, the attached substance in the chamber or the gas discharge pipe is efficiently removed.

(e) It is not necessary to perform the attached substance removal step each time the etching step is performed. The attached substance removal step may be performed after the etching step is performed a plurality of cycles. Decrease in the number of cycles of the attached substance removal step improves the efficiency of use of the device.

(f) Iodine heptafluoride ($IF_7$) has a high bonding energy and is stable as a compound. Therefore, in the case where $IF_7$ is used as the etching gas, the reactivity thereof with a mask material is lower than $ClF_3$ or $XeF_2$ and thus is not highly reactive with the mask material. Thus, $IF_7$ is highly selective with respect to a film other than a silicon film and is usable for a structural body such as a semiconductor element including a film other than a silicon film.

(g) Especially in the case where the cleaning gas contains $ClF_3$ and is put into contact with the iodine oxide in a temperature range of 25° C. or higher and 200° C. or lower and a pressure range of 66 Pa or higher and 101 kPa or lower, the attached substance in the chamber or the gas discharge pipe is efficiently removed. Thus, the etching step is repeated while the etching efficiency is maintained.

(h) Especially in the case where the cleaning gas contains $ClF_3$, the iodine oxide is removed even at a low temperature. Therefore, the etching with iodine heptafluoride and the removal of the attached substance with $ClF_3$ may be performed at about the same temperature. This is preferable because the load on the device is decreased.

(Embodiment 3)

Embodiment 3 according to the present invention is regarding a dry etching technology including an etching step of removing silicon with an iodine-containing gas and a post-process step of removing an iodine compound generated by the etching step.

Hereinafter, the embodiment according to the present invention will be described in detail.

Embodiment 3 according to the present invention is regarding a dry etching method including an etching step of removing a film on a substrate with an iodine-containing gas and a post-process step of removing an iodine compound generated by the etching step. In the post-process step, a post-process gas containing a fluorine-containing gas that does not contain iodine (I) is put into contact with a surface of the substrate to remove the iodine compound deposited on the surface of the substrate. Iodine heptafluoride ($IF_7$) is especially preferable as the iodine-containing gas. As the fluorine-containing gas, chlorine tetrafluoride ($ClF_3$) or fluorine ($F_2$) is especially preferable. In the post-process step, it is preferable that the temperature of the substrate is higher than that in the etching step. A reason for this is that an iodine compound such as iodine pentafluoride ($IF_5$) or the like deposited on the substrate as a by-product is removed efficiently at such a higher temperature.

An overview of a process performed on the substrate in embodiment 3 will be described.

The substrate process step in embodiment 3 includes a step of transporting the substrate into a processing chamber, a step of adjusting the pressure in the processing chamber to a predetermined level, an etching step of supplying an etching gas containing an iodine-containing gas to remove a silicon film on the substrate, a post-process step of supplying a fluorine-containing gas not containing iodine to remove an iodine compound attached to a surface of the substrate, and a step of transporting the substrate out of the processing chamber. After the post-process step, a heating step may be performed of heating the substrate to a temperature higher than the sublimation temperature of the iodine compound to efficiently remove the iodine compound.

In embodiment 3 according to the present invention, the etching reaction on the thin film on the substrate is expressed by the following expression.

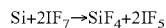

$$Si+2IF_7 \rightarrow SiF_4+2IF_5$$

After the etching step, the supply of the etching gas containing the iodine-containing gas (in this example, $IF_7$) is stopped. In the etching step, an iodine compound such as iodine pentafluoride ($IF_5$) or the like is deposited on the surface of the substrate. Therefore, in this embodiment, the post-process step is performed in which a fluorine-containing gas such as chlorine trifluoride ($ClF_3$) or the like is supplied to efficiently remove the iodine compound.

As described above, the post-process step is performed after the etching step, so that the iodine compound attached to at least the surface of the substrate is removed.

Like in embodiment 1 and embodiment 2, the attached substance removal step may be performed after the substrate is removed from the chamber. The attached substance removal step may be performed in substantially the same manner as in embodiment 1 or embodiment 2, and thus will not be described in detail. Needless to say, the etching method in this embodiment (embodiment 3) may be used in the attached substance removal step. The attached substance removal step is merely different from the etching step described here in that the substrate is not located in the chamber in the former, and thus will not be described in detail. In the attached substance removal step, the attached substance containing an iodine compound such as iodine pentafluoride or the like attached to the inside of the chamber or the gas discharge pipe is also removed.

Figure 9:
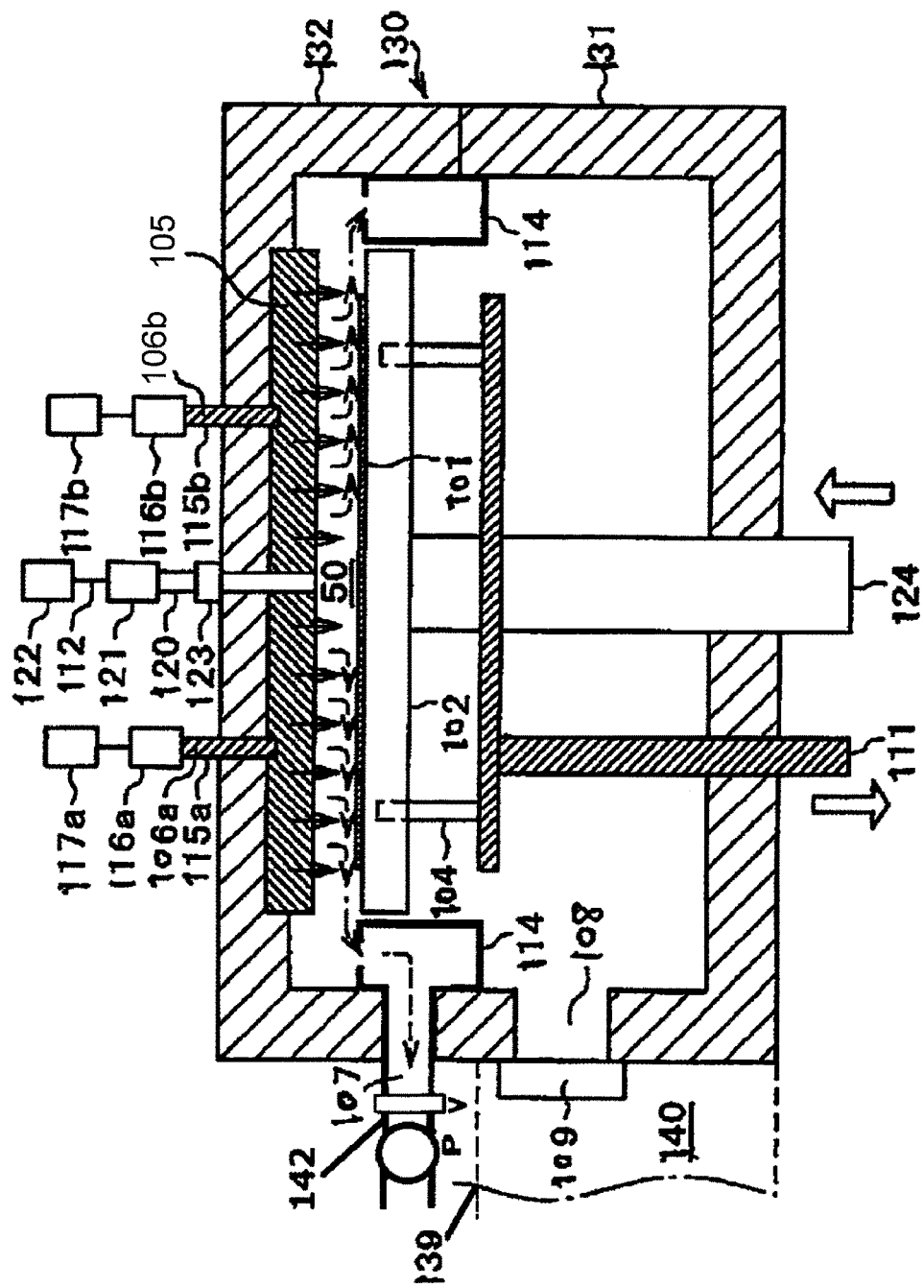
FIG. 9 is a schematic view of the etching device in embodiment 3 in the state where a substrate is being processed.
Figure 10:
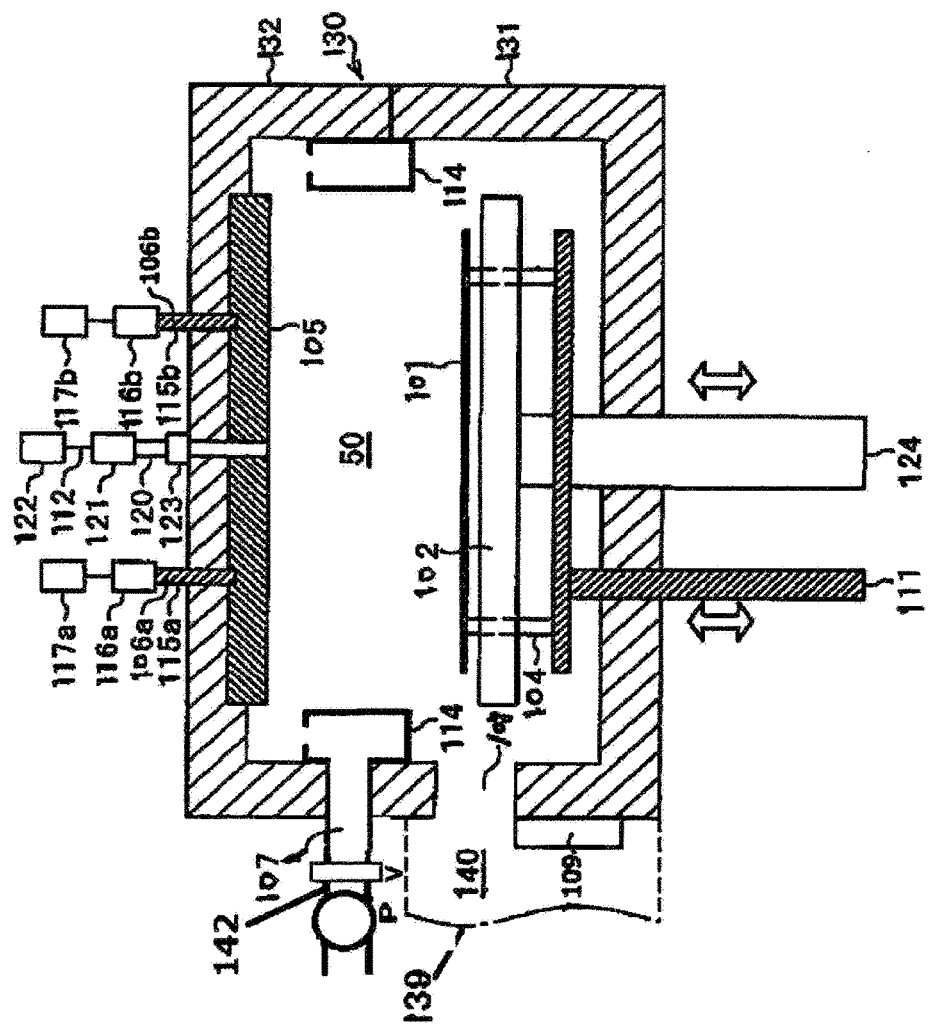
FIG. 10 is a schematic view of the etching device in embodiment 3 in the state where the substrate is being transported.

The dry etching method in embodiment 3 may be performed by use of a general etching device as shown in FIG. 9 or FIG. 10 usable for a semiconductor production process. There is no specific limitation on the structure of the etching device to be used for the dry etching method in embodiment 3. The dry etching method in embodiment 3 may be performed by use of, for example, a substrate processing device usable for a semiconductor device production method including a step of transporting a boat holding a plurality of substrates into a processing furnace, a step of performing a predetermined process on the substrates, and a step of, after the process, transporting the boat out of the processing furnace.

[Example 2]

With reference to FIG. 9 and FIG. 10, an overview of an etching device 100 used in embodiment 3 will be described.

(1) Structure of a Substrate Processing Device

FIG. 9 is a schematic vertical cross-sectional view of a substrate processing container included in a single-wafer substrate processing device (hereinafter, referred to simply as a "substrate processing device") usable to perform a method for producing a semiconductor device. FIG. 9 shows a state where a substrate is being processed. FIG. 10 is a schematic vertical cross-sectional view of the substrate processing container and shows a state where the substrate is being transported. In FIG. 10, a susceptor is at a lower, transportation position where a transportation step is performed.

As shown in FIG. 9 and FIG. 10, the substrate processing device as the etching device 100 includes a processing container (chamber) 130 in which a circular substrate 101 such as a silicon wafer or the like is processed, and a substrate transportation container 139 provided adjacent to the processing container 130. The substrate 101 is transported between the processing container 130 and the substrate transportation container 139. The processing container 130 includes a container main body 131 having a top opening and a lid 132 covering the top opening of the container main body 131. The processing container 130 has a sealed processing chamber 50 formed therein. The processing chamber 50 may be formed of a space (processing space) enclosed by the lid 132 and the susceptor 102. In this example of this embodiment, the container main body 131, the lid 132 and the processing chamber 50 are generally circular as seen in a plan view (as seen from above).

(Gas Supply Portion)

The lid 132 is provided with a shower head 105, process gas supply lines 106a and 106b, and an inert gas supply line 112. The shower head 105 is provided to face the substrate 101 located in the processing chamber 50, and supplies a process gas form the process gas supply lines 106a and 106b into the processing chamber 50. The shower head 105 is provided in a top part of an inner surface of the lid 132, and includes a gas dispersion plate (not shown) having a great number of gas holes to disperse the gas like a shower and a mixing chamber (not shown) usable for mixing the gas coming out of the plurality of holes. In the case where, for example, the process gas is supplied from the process gas supply lines 106a and 106b, diluted gas such as inert gas or the like is mixed in the mixing chamber.

The process gas supply lines 106a and 106b are connected with the shower head 105. Specifically, process gas supply pipes 115a and 115b included in the process gas supply lines 106a and 106b are opened toward the mixing chamber on a top part of the shower head 105.

The inert gas supply line 112 is provided to run throughout the shower head 105. For example, an inert gas supply pipe 120 included in the inert gas supply line 112 runs throughout a center part of the shower head 105 facing a center part of the substrate 101 and is opened toward the processing chamber 50.

As described above, the process gas supply lines 106a and 106b are connected with the shower head 105 and are configured to supply the process gas toward the substrate processing chamber 50 via the shower head 105. The inert gas supply line 112 is provided to run throughout the shower head 105 and is configured to supply the inert gas into the substrate processing chamber 50 not via the shower head 105.

Specifically, the process gas supply lines 106a and 106b respectively include the process gas supply pipes 115a and 115b connected with the shower head 105 and communicated with the mixing chamber, and also respectively include gas flow rate controllers (mass flow controllers; MSCs) 116a and 116b provided on the process gas supply pipes 115a and 115b. The process gas supply lines 106a and 106b are configured to supply a desired type of gas into the substrate processing chamber 50 at a desired gas flow rate and a desired gas flow rate ratio. In this embodiment, the process gas is an iodine-containing gas, for example, $IF_7$ gas. The process gas may be, for example, an iodine-containing gas diluted with an inert gas (e.g., $N_2$ gas). Especially, $IF_7$ gas, which is one type of iodine-containing gas, selectively removes a silicon film containing silicon as a main component. Herein, the term "selectively" refers to that, for example, the etching rate on the silicon film is higher than the etching rate on another film (e.g., metal film, oxide film, nitride film, oxide nitride film, etc.). Herein, the "silicon film containing silicon as a main component" refers to a silicon film containing at least 50% by weight of silicon.

Different types of process gas may be supplied from the process gas supply lines 106a and 106b in accordance with the specific content of the process performed on the substrate. Alternatively, the inert gas such as carrier gas or diluting gas may be supplied from either one of the process gas supply lines 106a and 106b.

The inert gas supply line 112 includes the inert gas supply pipe 120 and an MFC 121, and is configured to supply the inert gas into the processing chamber 50 at a desired flow rate. The inert gas supply line 112 further includes a heating portion 123, which heats the inert gas to be supplied into the processing chamber 50. The heating portion 123 is connected with a controller 500 described below, and may be controlled by the controller 500 to control the temperature of the inert gas to a desired level. In this embodiment, the inert gas supplied from the inert gas supply line 112 is $N_2$ (nitrogen) gas.

A process gas supply portion is configured to include the process gas supply pipes 115a and 115b, the MFCs 116a and 116b, and the shower head 105. The process gas supply portion (process gas supply line) may include process gas supply sources 117a and 117b. An inert gas supply portion is configured to include the inert gas supply pipe 120 and the MFC 121. The inert gas supply portion (inert gas supply line) may include an inert gas supply source 122. A gas supply portion includes the process gas supply portion and the inert gas supply portion.

The lid 132 may be provided with a remover supply line usable to supply a remover such as, for example, hydrogen fluoride gas capable of removing a denatured layer (naturally generated oxide film) to the substrate 101, a cleaning gas supply line usable to supply a cleaning gas (e.g., chlorine trifluoride ($ClF_3$) gas, etc.), a post-process gas supply line usable to supply a post-process gas described below, or the like as necessary as a part of the gas supply portion.

A gas discharge opening 107 is provided in a top part of the container main body 131. The gas discharge opening 107 is in communication with an annular path 114 formed in an inner circumferential surface of the top part of the container main body 131, and is configured to discharge the gas in the substrate processing chamber 50 via the annular path 114. The annular path 114 is annular as seen in a plan view. The gas discharge opening 107 is connected with a gas discharge pipe 142, and the gas discharge pipe 142 is provided with an APC valve V (automatic pressure adjusting valve) and a vacuum pump P. The amount of the gas to be supplied and the amount of the gas to be discharged are adjusted by the APC valve V and the MFCs in the gas supply portion, so that the pressure in the processing chamber 50 is controlled to be a desired level. The gas discharge opening 107 and the annular path 114 may be provided in a bottom part of the lid 132.

A transportation opening 108 is provided on one side of the container main body 131 below the gas discharge opening 107. The pre-processing substrate 101 is transported via the transportation opening 108 from a substrate transportation chamber 140 formed in the transportation container 139 into the substrate processing chamber 50 in the processing container 130. The post-processing substrate 101 is transported via the transportation opening 108 out of the substrate processing chamber 50 into the substrate transportation chamber 140. The transportation opening 108 of the container main body 131 is provided with an open/close valve 109 used to isolate the atmosphere in the substrate transportation chamber 140 and the atmosphere in the substrate processing chamber 50 from each other. The open/close valve 109 is freely openable or closable.

In the processing container 130, the susceptor (substrate table) 102 having a built-in heater unit H (not shown) is provided. The susceptor 102 is provided in the substrate processing chamber 50 in the processing container 130 so as to be freely moved up or down. The substrate 101 is held on a surface of the susceptor 102. The substrate 101 is heated by the heater unit H.

A plurality of support pins 104 stand on a substrate support pin up/down moving mechanism 111. The support pins 104 are insertable through the heater unit H and the susceptor 102, and are configured to protrude from, or to be recessed into, the surface of the susceptor 102 as the substrate support pin up/down moving mechanism 111 is moved up or down.

The substrate processing device is configured such that, when the susceptor 102 is moved down to the position where the transportation step is performed (position shown in FIG. 10; hereinafter, this position will be referred to as a "transportation position A"), the plurality of support pins 104 protrude from the susceptor 102 to support the substrate 101 thereon and the substrate 101 is transported between the substrate processing chamber 50 and the substrate transportation chamber 140 via the transportation opening 108. The substrate processing device is configured such that, when the susceptor 102 is moved up beyond a middle position above the "transportation position A" to reach a position where a process step is performed, (position shown in FIG. 9; hereinafter, this position will be referred to as a "substrate processing position B"), the plurality of support pins 104 do not support the substrate 101 and the substrate 101 is placed on the susceptor 102.

A support shaft 124 for the susceptor 102 is coupled with an up/down moving mechanism UD (not shown), and the susceptor 102 is configured to be moved up or down in the substrate processing chamber 50. Bellows (not shown) are provided on an outer circumferential surface of the support shaft 124 to seal the support shaft 124. The up/down moving mechanism UD is configured to adjust the susceptor 102 in the substrate processing chamber 50 to be at a desired position in the up-down direction (transportation position A, substrate processing position B, etc.) in a step-by-step manner in each of a substrate transporting-in step, a substrate process step, and a substrate transporting-out step.

The susceptor 102 is rotatable in a horizontal direction. Namely, the support shaft 124, which is cylindrical, is rotatable by a rotation mechanism R (not shown), and the susceptor 102 is configured to be rotatable using the support shaft 124 as the rotation center, so that the susceptor 102 is rotatable at any rate while holding the substrate 101. By contrast, the heater unit H, which is of a resistance heating type, provided in the susceptor 102 is secured and is supported by a securing portion (not shown) inserted through the cylindrical support shaft 124. The susceptor 102 is rotatable and the resistance heating type heater H is secured in this manner, so that the susceptor 102 is rotatable with respect to the resistance heating type heater H.

Figure 11:
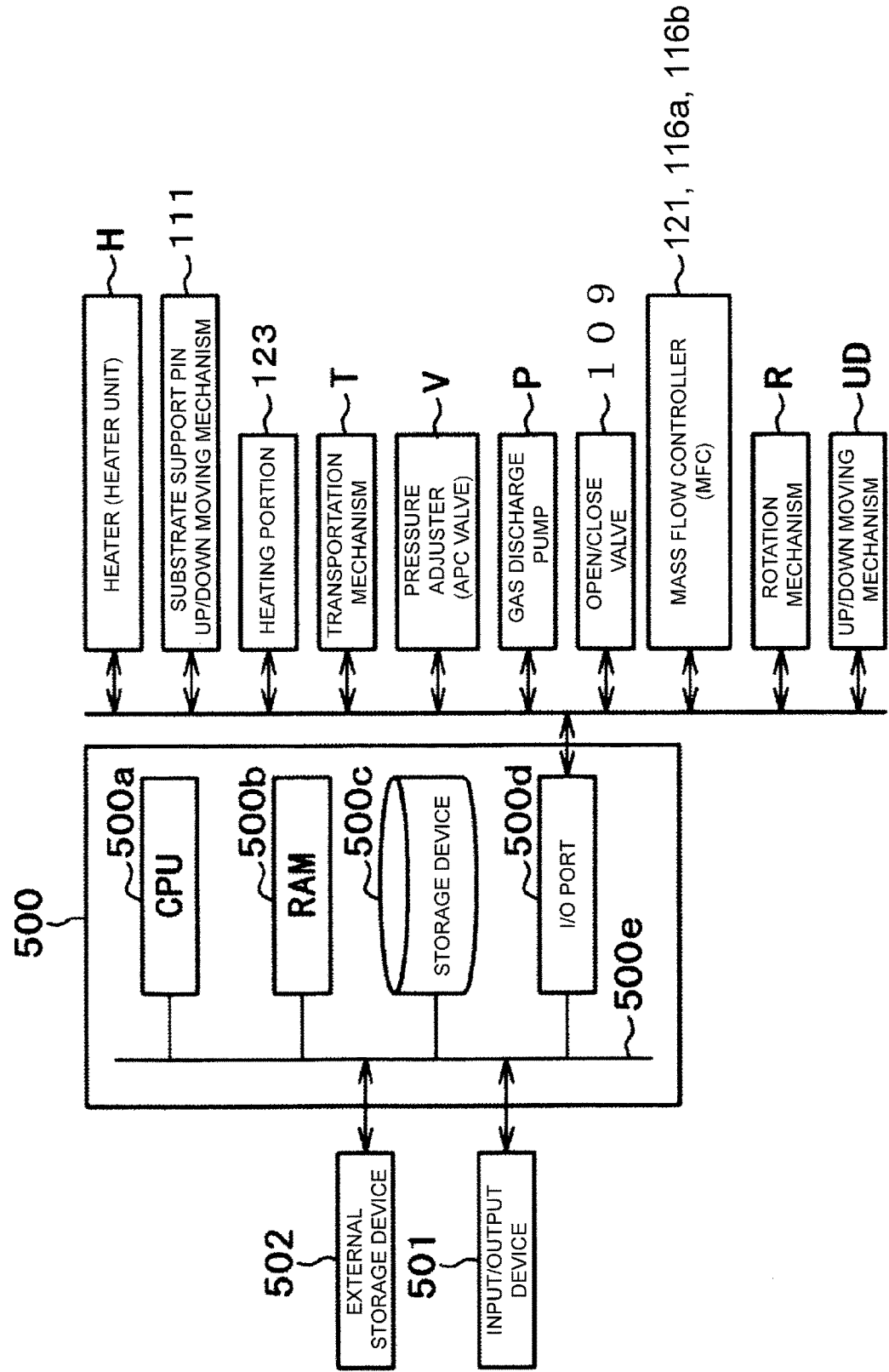
FIG. 11 is a structural view of a control device in the etching device in embodiment 3.

An example of structure of the controller 500 as a control unit controlling the components such as the up/down moving mechanism UD, the rotation mechanism R, the resistance heating type heater H, the MFCs 121 and 116 (116a, 116b), and the like is shown in FIG. 11, which will be referred to below.

The thin film on the substrate is removed by the above-described substrate processing device as follows. In the transporting-in step, the substrate 101 is transported into the processing chamber 50. In the process step, the process gas (etching gas) is supplied via the shower head 105 to the substrate 101 transported into the processing chamber 50 to process the substrate 101. In the transporting-out step, the post-processing substrate 101 is transported out of the processing chamber 50.

In the transporting-in step, the susceptor 102 is at the transportation position A, and the support pins 104 are in the state of capable of receiving the substrate 101. The open/close valve 109 of the processing container 130 is opened. The substrate 101 having a film containing at least silicon formed thereon is transported from the substrate transportation chamber 140 via the transportation opening 108 into the substrate processing chamber 50 by a transportation mechanism T (not shown), and are supported by the plurality of support pins 104 (FIG. 10). The open/close valve 109 is closed after the substrate is transported. The gas in the substrate processing chamber 50 is discharged by the vacuum pump P from the gas discharge opening 107 via the annular path 114.

In the process step, first, the susceptor 102 is raised from the transportation position A (FIG. 10) toward the substrate processing position B (FIG. 9) by the up/down moving mechanism UD. Before the susceptor 102 reaches the substrate processing position B, the substrate 101 is moved from the state of being supported by the support pins 104 to the state of being supported by the susceptor 102, and is heated by the heater unit H via the susceptor 102. The substrate 101 moved to the state of being supported by the susceptor 102 at the substrate processing position B faces the shower head 105 (FIG. 9). In this state, the susceptor 102 is rotated by the rotation mechanism R as necessary to rotate the substrate 101.

The process gas is supplied as represented by the arrows in FIG. 9 from the process gas supply lines 106 (106a, 106b) via the shower head 105 toward the surface of the rotating substrate 101 in the processing chamber 50, while the gas is discharged from the gas discharge opening 107. In this step, the silicon film formed on the substrate 101 is removed. After the silicon film is removed, the process gas usable to remove a reaction by-product in this embodiment (hereinafter, referred to as a "post-process gas") is supplied as represented by the arrows in FIG. 9 from the process gas supply lines 106a and 106b, like the process gas as the etching gas. The process gas is introduced into the shower head 105 from the process gas supply lines 106a and 106b. The inert gas is supplied into the processing chamber 50 from the inert gas supply line 112 connected to the center part of the shower head 105 facing the center part of the substrate 101.

The flow of the process gas introduced into the shower head 105 may be controlled by the inert gas introduced into the processing chamber 50 from the shower head 105. For example, the flow rate of the inert gas flowing in the inert gas supply pipe 120 is adjusted by the MFC 121 included in the inert gas supply line 112, such that the film thickness or the film quality in the center part of the substrate 101, where an inconvenience easily occurs, is optimum.

After the substrate is processed, in the transportation-out step, the susceptor 102 is lowered to the transportation position A (FIG. 10). While the susceptor 102 is being lowered, the support pins 104 push up the substrate 101 again to form a gap for transportation between the susceptor 102 and the substrate 101. After the processing, the substrate 101 is carried out from the transportation opening 108 to the substrate transportation chamber 140 by the transportation mechanism T.

(2) Structure of the Controller

The controller 500 controls the above-described components such that the transportation-in step, the process step and the transportation-out step are performed.

As shown in FIG. 11, the controller 500 as a control portion (control unit) is configured as a computer including a CPU (Central Processing unit) 500a, a RAM (Random Access Memory) 500b, a storage device 500c, and I/O port 500d. The RAM 500b, the storage device 500c and the I/O port 500d are configured to exchange data with the CPU 500a via an internal bus 500e. The controller 500 is connected with an input/output device 501 configured as, for example, a touch panel or the like.

The storage device 500c is a storage medium such as, for example, a flash memory, an HDD (Hard Disk Drive) or the like. The storage device 500c has, stored thereon, a control program controlling an operation of the substrate processing device, a process recipe describing, for example, procedures of, or conditions for, the substrate processing described below. The control program, the process recipe, and the like are stored so as to be readable. The "process recipe" is an assembly of processes assembled so as to allow the controller 500 to execute the procedures in the substrate process step (etching process step) described below to obtain a predetermined result, and acts as a program. Hereinafter, the process recipe, the control program and the like may be collectively referred to simply as a "program". In this specification, the term "program" may refer only to a process recipe, may refer only to a control program, or may refer to both of the process recipe and the control program. The RAM 500b is a memory area (work area) where a program, data or the like read by the CPU 500a is temporarily stored. The control program in this embodiment may be referred to as a "second control program" as opposed to the first control program used in embodiment 1 and embodiment 2.

The I/O port 500d is connected with the heater unit H, the substrate support pin up/down moving mechanism 111, the heating portion 123, the transportation mechanism T, the APC valve V, the gas discharge pump (vacuum pump) P, the open/close valve 109, the MFCs 121, 116a and 116b, the rotation mechanism R, the up/down moving mechanism UD and the like.

The CPU 500a is configured to read the control program from the storage device 500c and execute the control program and also to read the process recipe from the storage device 500c and execute the process recipe in response to an input or the like of an operation command from the input/output device 501. The CPU 500a is configured to control the upward and downward moving operation of the support pins 104 by the substrate support pin up/down moving mechanism 111, the heating and cooling operation of the substrate 101 by the heater unit H, the flow rate adjusting operation of the process gas by the MFCs 121, 116a and 116b, and the like along with the read process recipe.

The controller 500 may be configured as a dedicated computer or as a general-purpose computer. For example, the an external storage device (e.g., a magnetic tape; a magnetic disc such as, a flexible disc, a hard disc or the like; an optical disc such as a CD, a DVD or the like; a magneto-optical disc such as an MO or the like; or a semiconductor memory such as a USB memory (USB Flash Drive), a memory card or the like) 502 may be prepared and a program may be installed on a general-purpose computer by use of the external storage device 502 to provide the controller 500 in this embodiment.

The method for supplying a program to the computer is not limited to using the external storage device 502. For example, the program may be supplied by use of a communication measure such as the Internet, a dedicated line or the like, without using the external storage device 502. The storage device 500c and the external storage device 502 are each configured as a computer-readable storage medium. Hereinafter, such a computer-readable storage medium may be referred to simply as a "storage medium". In this specification, the term "storage medium" may refer only to the storage device 500c, may refer only to the external storage device 502, or may refer to both of the storage device 500c and the external storage device 502.

(3) Etching Process Step (Dry Etching Step)

Now, with reference to FIG. 8, the substrate process step (etching process step) performed as one step of the semiconductor production process in this embodiment will be described. This step is performed by the above-described substrate processing device. In the following description, each of the components of the substrate processing device is controlled by the controller 500.

(Substrate Transportation-in Step S10)

First, the substrate 101 having a film containing at least silicon as a main component is transported into the processing chamber 50 from the substrate transportation chamber 140 via the transportation opening 108 by the transportation mechanism T, and then is supported by the support pins 104.

(Silicon Film Removal Step S20)

Next, the susceptor 102, or the susceptor 102 and the substrate support pin up/down moving mechanism 111, are raised to the substrate processing position B, so that the substrate 101 is placed on the susceptor 102. The heater H provided in the susceptor 102 is heated in advance to a predetermined temperature, and heats the substrate 101 to a predetermined substrate temperature. It is preferable to use a cooling mechanism removing excessive heat (reaction heat) as necessary.

After the temperature of the substrate 101 reaches the predetermined level, the predetermined etching gas is supplied to the substrate 101 from the process gas supply lines 106a and 106b via the shower head 105 for a predetermined time duration. The etching process is performed on the silicon film on the substrate 101 at, for example, a substrate temperature of 50° C. or lower. The temperature of the etching gas is, for example, room temperature. In this step, the inert gas may be supplied to the substrate 101 from the inert gas supply pipe 120. The etching gas used for the etching process is discharged from the gas discharge opening 107 provided in the side surface of the processing chamber 50 and in communication with the annular path 114.

Concurrently with the supply of the etching gas, the amount of the gas to be discharged is adjusted by the APV valve V, so that the pressure in the processing chamber 50 is maintained at a predetermined level. As soon as the etching gas is supplied, the etching on the silicon film is started. Therefore, it is desirable that the pressure and the flow rate of the gas are each set to a predetermined value quickly.

As the etching gas, an iodine (I)-containing gas is used. For example, a gas containing a halogen element of iodine (I) is used. Preferably, iodine heptafluoride ($IF_7$) gas is selected. At room temperature, $IF_7$ gas has an etching rate of almost zero for a silicon oxide film, an amorphous carbon film, and a silicon nitride film, but has a significantly high etching rate of 1 μm or greater per minute for a silicon film.

In this embodiment, the silicon film removal step S20 includes a post-process step of, after the silicon film is removed with the iodine-containing gas (etching gas), removing a reaction by-product generated by the reaction of the etching gas and the silicon film. Specifically, in the post-process step, the amount of gas to be discharged is adjusted by the APC valve V, like for the etching gas, to maintain the pressure in the processing chamber 50 to a predetermined level, while the predetermined post-process gas is supplied to the substrate 101 from the process gas supply lines 106a and 106b via the shower head 105.

In the case where the silicon film has a denatured layer of about several atoms formed thereon, it is preferable that a denatured layer removing gas usable to remove the denatured layer (e.g., hydrogen fluoride gas) is supplied to the substrate before the process gas (etching gas) is supplied. Herein, the term "denatured layer" is a naturally generated oxide film generated on the silicon film. The naturally generated oxide film, even if having a thickness of merely several atoms, cannot be removed by the above-described process gas, and inhibits the removal of the silicon film. The supply of the denatured layer removing gas allows the denatured layer on the silicon film to be removed while the other film structure is maintained, and thus allows the silicon film to be removed by the process gas in a microscopic manner.

After the removal step S20 is performed for a predetermined time duration, the supply of the process gas is stopped, and the atmosphere (gas) in the processing container 130 is discharged from the gas discharge opening 107.

(Purge Step S30)

After the removal step (etching step) S20 is finished, the inert gas, for example, nitrogen gas, is supplied to the substrate 101 from the inert gas supply pipe 120 via the shower head 105. It is preferable that the nitrogen gas is supplied in the state of being heated to, for example, 90° C. or higher, by the heating portion 123. In the case where the inert gas is heated to a temperature higher than the sublimation temperature of the by-product generated in the etching step, the efficiency of removing the by-product generated at the time of etching is improved.

In this embodiment, the purge step S30 includes a heating step of, after the by-product is removed by the post-process gas, heating the substrate to a temperature higher than, or equal to, the predetermined level described above. Specifically, the substrate is heated to a temperature higher than, or equal to, the sublimation temperature of the by-product generated in the silicon film removal step (e.g., the sublimation temperature of $IF_5$).

Conventionally, as a measure against the generation of a by-product, which is a compound of silicon and the etching gas at the time of etching silicon on the substrate 101, the substrate 101 is moved to an anneal chamber after the etching process and is heated to a temperature at which the by-product on the substrate 101 is sublimed. In this case, the anneal process performed on the substrate 101 in the anneal chamber is time-consuming, which obstructs the improvement of productivity. By contrast, in this embodiment, the problem of the generation of the by-product is alleviated by supplying the inert gas in the state of being heated by the heating portion 123.

(Substrate Transportation-out Step S40)

After the purge step S30 is finished, the supply of the inert gas is stopped, and the atmosphere in the processing container 130 is discharged from the gas discharge opening 107. The support pins 104 are raised to separate the substrate 101 from the susceptor 102, and the substrate 101 is cooled to a temperature at which the substrate 101 can be transported.

After the substrate 101 is cooled to the temperature at which the substrate 101 can be transported and is prepared to be transported out of the processing chamber 50, the substrate 101 is transported in a procedure opposite to that of the substrate transportation-in step S10.

Figure 8:
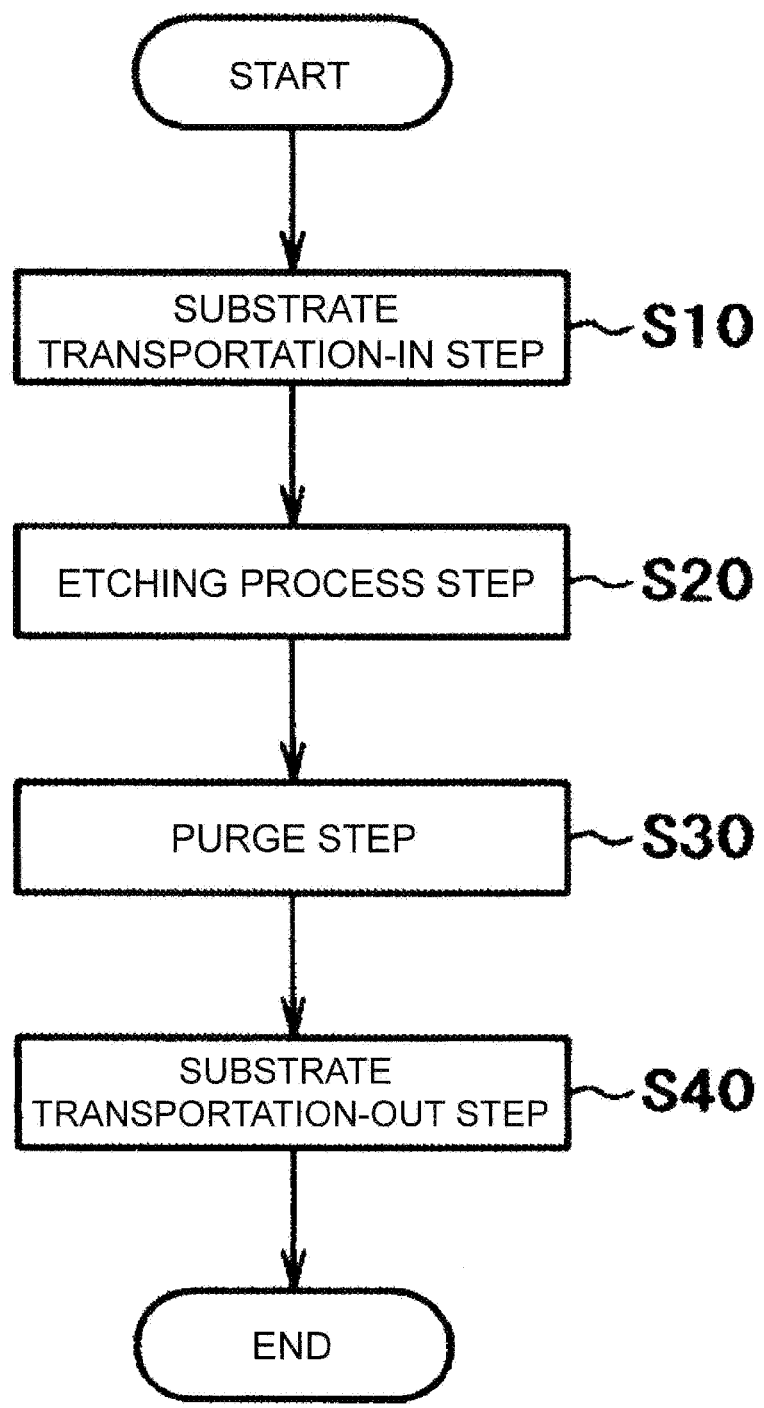
FIG. 8 shows a dry etching process performed by use of an etching device in embodiment 3.
Figure 12:
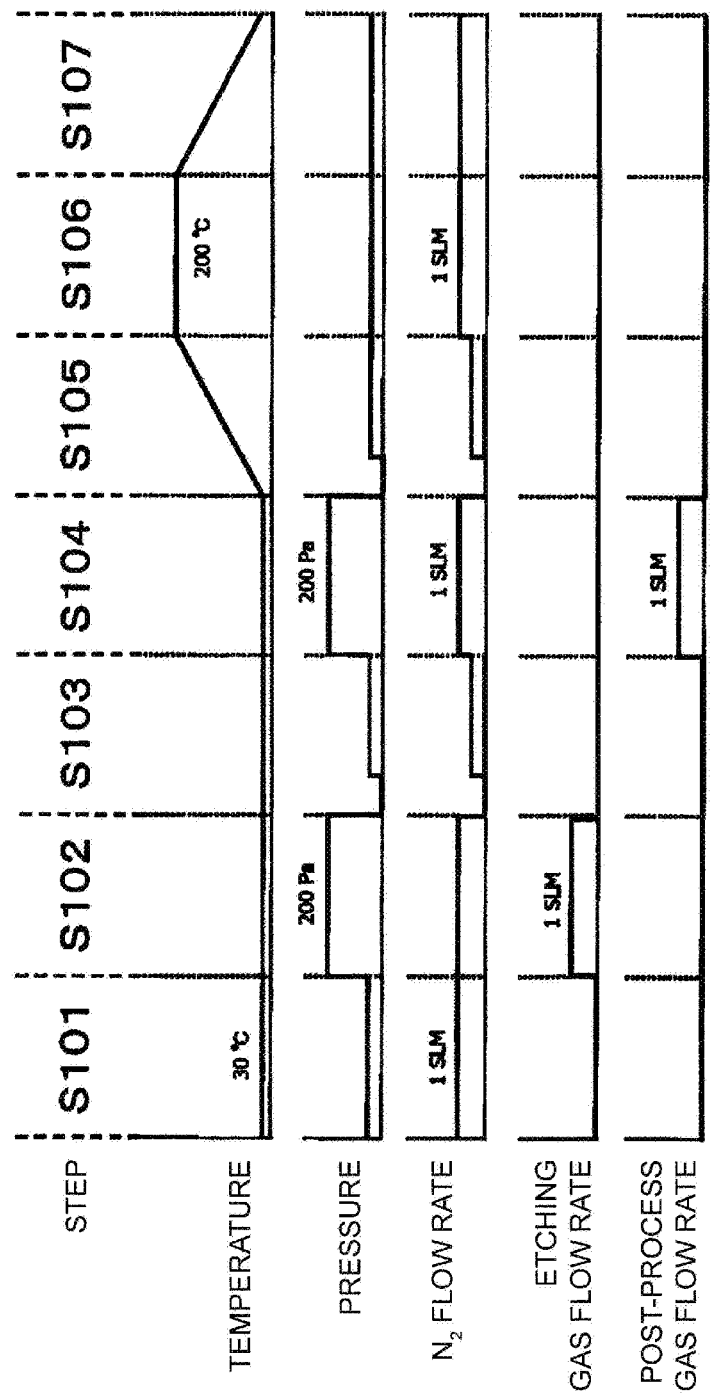
FIG. 12 is a timing diagram of gas supply in a dry etching step in embodiment 3.

FIG. 12 shows S20 and S30 of the substrate process step shown in FIG. 8 in detail.

The etching process step in this embodiment shown in FIG. 12 includes seven steps of a pre-purge step (S101), an etching step (S102), a vacuum purge step (S103), a treatment (post-process) step (S104), a temperature raising purge step (S105), a heating step (S106), and a temperature lowering purge step (S107). The etching step (S20) includes at least the etching step (S102) and the treatment step (S104), and the purge step (S30) includes the heating step (S106). Incorporation of the heating step (S106) into the purge step (S30) is preferable to remove the iodine compound. However, this causes a change in the substrate temperature and thus slightly deteriorates the throughput. Therefore, the heating step is optional. In FIG. 12, the steps are shown as if being performed in the same time duration, but needless to say, the steps are performed in different time durations. Hereinafter, each of the steps will be described. Needless to say, the steps shown in FIG. 12 are performed by execution of the control program.

In the pre-purge step (S101), a preparation for the etching step, which is to be performed next, is performed. The substrate temperature and the pressure are each maintained at a predetermined level. In this embodiment, the temperature is 30° C., the pressure is 50 Pa, and the flow rate of the inert gas is 1 SLM. When the substrate temperature and the pressure are each stabilized at the predetermined level, the operation advances to the next step (S102). Herein, the "predetermined substrate temperature" refers to a temperature range in which the process gas (etching gas) is sufficiently vaporized and the characteristics of the film formed on the substrate 101 are not changed. The substrate is maintained at a temperature of, for example, 20° C. or higher and 90° C. or lower, preferably 30° C. or higher and 50° C. or lower. The predetermined pressure is, for example, 0.1 Pa or higher and 200 Pa or lower.

In the etching step (S102), the etching gas containing an iodine-containing gas is supplied to the processing chamber 50 to remove the silicon film on the substrate 101. Iodine heptafluoride ($IF_7$) is especially preferable as the iodine-containing gas. The flow rate of the etching gas is set to a predetermined level in the range of about 0.1 SLM (standard liter per minute) or higher and about 10 SLM or lower. The flow rate of the etching gas is set to, for example, 1 SLM. As necessary, the etching gas may be supplied after the atmosphere in the processing chamber 50 is discharged. In this embodiment, for example, the temperature is 30° C., the pressure is 200 Pa, and the flow rate of each of the $IF_7$ and the inert gas is 1 SLM. The etching time is appropriately determined in accordance with the thickness of the silicon film to be etched. After the $IF_7$ gas is supplied for a preset time duration, the operation advances to the next step (S103).

In the vacuum purge step (S103), the supply of the etching gas is stopped. The supply of the inert gas (e.g., $N_2$ gas) is stopped to perform a vacuum/gas discharge step of discharging the gas to provide a vacuum state. Next, the inert gas (e.g., 0.5 SLM) is supplied to perform the step of purging the inside of the processing chamber 50. When the temperature and the pressure are each stabilized at a predetermined level, the operation advances to the next step (S104). In this embodiment, the temperature is maintained at 30° C., and the pressure is maintained at 50 Pa.

In the treatment (post-process) step (S104), the temperature is 30° C., the pressure is 200 Pa, and the flow rate of each of the post-process gas (e.g., $ClF_3$ gas) and the inert gas is 1 SLM. In the post-process step, the iodine compound attached to the substrate 101, the inner wall of the processing chamber 50 or the like is removed. In the step of removing the by-product generated at the time of etching, it is preferable to use a fluorine-containing gas not containing iodine. Such a fluorine-containing gas is, for example, fluorine ($F_2$), chlorine trifluoride ($ClF_3$) or the like.

In the temperature raising purge step (S105), the temperature is raised to a target level. In this step, the step of discharging the gas in the processing chamber 50 to provide a vacuum state while the supply of the inert gas is stopped (vacuum/gas discharge step) and a step of maintaining the pressure at 50 Pa while the inert gas is supplied at a flow rate of 0.5 SLM (pressure maintaining step) are performed. After these steps, the temperature is raised to the target level (200° C.) from 30° C. It is preferable that the target temperature is set to a level higher than, or equal to, the sublimation temperature of the iodine compound. In the case where the iodine compound is $IF_5$, the sublimation temperature thereof is about 95° C. Therefore, it is preferable that the target temperature is set to 100° C. or higher. It should be noted that raising the temperature to a high level requires a long time. Therefore, it is not preferable in terms of the throughput that the target temperature is too high. In the case where, for example, $ClF_3$ is used in the post-process in this embodiment, it is preferable that the target temperature is set to a temperature at which a by-product, even if being generated, is not attached (about 200° C.). When the temperature reaches the predetermined target level, the operation advances to the next step (S106).

In the heating step (S106), the substrate is heated to a temperature higher than, or equal to, the sublimation temperature of the iodine compound deposited on the surface of the substrate. Therefore, the supply of the inert gas (e.g., 1 SLM) causes the sublimed iodine compound to be discharged together with the inert gas. Thus, the amount of the iodine compound, which is the by-product, is efficiently deceased. After a predetermined time duration, the operation advances to the next step (S107).

In the temperature lowering purge step (S107), the temperature is lowered from the target temperature (200° C. in this embodiment) to the temperature before the temperature rise (30° C. in this embodiment). When the temperature reaches the temperature before the temperature rise, the dry etching process in this embodiment is finished.

Figure 13:
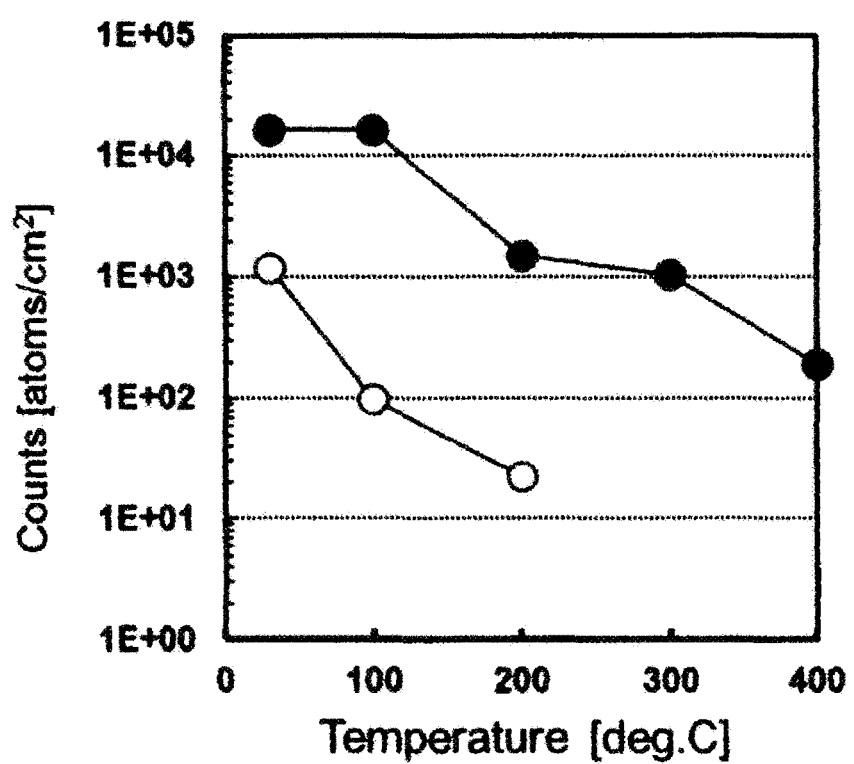
FIG. 13 shows experimental results on the dry etching in embodiment 3.

FIG. 13 show the temperature dependence of the strength of iodine (I) on the surface of the substrate after the etching process step. The vertical axis represents the strength of iodine (I), and the horizontal axis represents the substrate temperature. Data represented by white circles indicates the results of execution of the sequence shown in FIG. 12. Data represented by black circles indicates the results of execution of only the annealing process without the post-process with chlorine trifluoride ($ClF_3$) being executed.

It is seen by this that the strength of iodine (I) on the surface of the substrate is decreased as the annealing temperature is raised. It is also seen that the strength of iodine (I) is efficiently decreased by a combination of the annealing process and the post-process with chlorine trifluoride ($ClF_3$).

Conventionally, in the step of etching a film on the substrate with iodine heptafluoride gas, a by-product such as iodine pentafluoride ($IF_5$) or the like is generated by decomposition of iodine heptafluoride gas ($IF_7$) or a reaction of iodine heptafluoride and silicon. Such a by-product is attached to the inside of the chamber in which the substrate is processed or to the gas discharge pipe, or is deposited on the surface of the substrate. Such a by-product is stable at room temperature and thus is not easily volatized and is not removed by the purge with the inert gas performed after the etching. As a result, the surface of the substrate is kept contaminated with iodine. If the inside of the chamber, the gas discharge pipe or the surface of the substrate is exposed to the air, the by-product containing the iodine compound reacts with moisture in the air to generate hydrogen iodide (HI), iodic acid ($HIO_3$) or the like. This involves a risk of inducing corrosion of the surface of the substrate or the metal component in the chamber or the gas discharge pipe. In this embodiment, the by-product containing the iodine compound generated in the etching step is efficiently removed. Thus, such a problem is solved.

This embodiment (embodiment 3) provides at least one effect among (a) through (c) in addition to the effect provided by embodiment 1 and embodiment 2.

(a) In this embodiment, the post-process step is performed after the etching step. Thus, the iodine compound at least attached to the inside of the chamber or deposited on the surface of the substrate is removed, and the iodine oxide attached to the inside of the chamber or the gas discharge pipe is also removed. Therefore, the number of cycles of the attached substance removal step is decreased, and the rate of operation of the device is improved.

(b) In this embodiment, the post-process step is performed after the etching step. Thus, the iodine compound on the surface of the substrate is removed. Therefore, in the case where etching is performed continually, the etching fault is suppressed.

(c) In this embodiment, the post-process step is performed after the etching step. Thus, the iodine compound deposited on the wall of the chamber or the surface of the substrate is removed. Therefore, even if the processing chamber is opened for maintenance, corrosion of the metal component in the chamber caused by generation of hydrogen iodide (HI), iodic acid ($HIO_3$) or the like by a reaction of the iodine compound with moisture in the air is suppressed.

<Effects Provided by the Present Invention>

Conventionally, patterns have been made microscopic progressively for a higher degree of integration. As the patterns are made progressively reduced in size, problems inherent to such size-reduced patterns occur. An example of such problems is that a pattern is destroyed by the surface tension of a liquid used for wet etching. In, for example, the step of removing silicon (Si), washing with pure water is performed after the etching is performed with an aqueous solution of tetramethylammonium hydroxide (TMAH) or the like, and drying is performed while the pure water is replaced with isopropyl alcohol (IPA), which has a smaller surface tension than that of pure water. Thus, the pattern is prevented from being destroyed by the surface tension of a washing liquid. However, as the patterns are further reduced in size, even this method is not sufficient to prevent the destruction of the patterns. As a measure against this problem, the dry etching of removing silicon with etching gas according to the present invention is usable. This method is usable even if patterns are further reduced in size in the future.

For producing a device having a three-dimensional structure such as a NAND flash memory or the like, conventional reactive ion etching using plasma is not usable to easily remove a polycrystalline silicon (Poly-Si) film at a high selectivity with respect to a film of a material other than polycrystalline silicon (e.g., silicon oxide ($SiO_2$) film, silicon nitride (SiN) film, silicon oxide nitride (SiON) film, carbon (C) film, etc.). Namely, it is very difficult with the conventional reactive ion etching using plasma to etch, after a through-groove is formed in a stack structure of a polycrystalline silicon (Poly-Si) film and a silicon oxide ($SiO_2$) film, only the polycrystalline silicon (Poly-Si) film from the layer including the polycrystalline silicon (Poly-Si) film and the silicon oxide ($SiO_2$) film exposed to a side wall. One reason for this is that there is a problem of selectivity with respect to the film other than the polycrystalline silicon film, and the other reason is that isotropic etching is needed. There is also a problem of selectivity with respect to a hard mask film (e.g., carbon film, etc.). It is also difficult to deal with the complicated structure of the device required by the size reduction of the pattern. As a measure against this problem, the dry etching method according to the present invention is usable by which silicon is removed by isotropic etching by use of etching gas in a plasma-free state. This dry etching method is usable for a pattern further reduced in size in the future. Especially, an iodine-containing gas containing iodine heptafluoride, for the chemical properties thereof, has a better selectivity with respect to a film other than a silicon film as compared with existing etching gas. Use of such an iodine-containing gas as the etching gas allows silicon to be removed. Therefore, this method is compatible to a more complicated structure of the device required by further size reduction of the pattern.

<Other Embodiments According to the Present Invention>

Embodiments according to the present invention have been specifically described. The present invention is not limited to any of the above-described embodiments, and may be modified in various manners without departing from the gist thereof. For example, the device in each of the above-described embodiments includes a processing chamber in which substrates are processed one by one. Alternatively, needless to say, a device, such as a multi-wafer device or a vertical device, that includes a processing chamber in which a plurality of substrates are processed at one time (batch process) may be used.

The present invention is not limited to being used for a substrate processing device of a semiconductor production device that processes a semiconductor wafer as in this embodiment, and is also usable for a substrate processing device of an LCD (Liquid Crystal Display) production device that processes a glass substrate, a substrate processing device of a solar cell production device or the like. The present invention is usable for, for example, a process performed on a transistor driving an LCD, or on single crystalline silicon, polycrystalline silicon or amorphous silicon usable for a solar cell.

<Preferable Embodiments According to the Present Invention>

Hereinafter, preferable embodiments according to the present invention will be described.

<Additional Description 1>

Provided in one embodiment according to the present invention is an attached substance removing method of removing an attached substance containing an iodine oxide attached to a surface of a component included in a chamber or a surface of a pipe connected with the chamber by use of a cleaning gas containing a fluorine-containing gas.

<Additional Description 2>

Provided is the attached substance removing method according to additional description 1, wherein the cleaning gas is put into contact with the attached substance in a temperature range of 20° C. or higher and 300° C. or lower and in a pressure range of 66 Pa or higher and 101 kPa or lower.

<Additional Description 3>

Provided is the attached substance removing method according to additional description 2, wherein the fluorine-containing gas contained in the cleaning gas is $ClF_3$; and the temperature range is 25° C. or higher and 200° C. or lower.

<Additional Description 4>

Provided is the attached substance removing method according to additional description 2, wherein the fluorine-containing gas contained in the cleaning gas is $F_2$; and the temperature range is 120° C. or higher and 200° C. or lower.

<Additional Description 5>

Provided is the attached substance removing method according to additional description 2, wherein the fluorine-containing gas contained in the cleaning gas is $IF_7$; and the temperature range is 230° C. or higher and 300° C. or lower.

<Additional Description 6>

Provided is the attached substance removing method according to any one of additional descriptions 1 through 5, wherein the fluorine-containing gas contained in the cleaning gas contains at least one type of fluorine (F) selected from the group consisting of HF, $F_2$, $XF_n$ (X represents any one of Cl, Br and I; and n represents an integer of 1 or greater and 7 or less).

<Additional Description 7>

Provided is the attached substance removing method according to any one of additional descriptions 1 through 6, wherein the iodine oxide contained in the attached substance is represented by chemical formula $I_xO_yF_z$ (x represents an integer of 1 or 2, y represents an integer of 1 or greater and 5 or less, and z represents an integer of 0 or 1).

<Additional Description 8>

Provided is the attached substance removing method according to additional description 1, 2 or 7, wherein the iodine oxide is $I_2O_5$.

<Additional Description 9>

Provided in another embodiment according to the present invention is a dry etching method including the steps of:

supplying an etching gas containing an iodine-containing gas into a chamber to perform etching on a surface of a substrate; and after the etching is performed on the surface of the substrate, removing an attached substance containing an iodine oxide attached to a surface of a component included in the chamber or a surface of a pipe connected with the chamber by use of a cleaning gas containing at least a fluorine-containing gas.

<Additional Description 10>

Provided is the dry etching method according to additional description 9, wherein the cleaning gas is put into contact with the attached substance in a temperature range of 20° C. or higher and 300° C. or lower and in a pressure range of 66 Pa or higher and 101 kPa or lower.

<Additional Description 11>

Provided is the dry etching method according to additional description 9 or 10, wherein the fluorine-containing gas contained in the cleaning gas contains at least one type of fluorine (F) selected from the group consisting of HF, $F_2$, $XF_n$ (X represents any one of Cl, Br and I; and n represents an integer of 1 or greater and 7 or less).

<Additional Description 12>

Provided is the dry etching method according to additional description 11, wherein the fluorine-containing gas contained in the cleaning gas is $ClF_3$.

<Additional Description 13>

Provided is the dry etching method according to additional description 9, wherein the iodine oxide contained in the attached substance is represented by chemical formula $I_xO_yF_z$ (x represents an integer of 1 or 2, y represents an integer of 1 or greater and 5 or less, and z represents an integer of 0 or 1).

<Additional Description 14>

Provided is the dry etching method according to additional description 9 or 10, wherein the fluorine-containing gas is one selected from fluorine ($F_2$), chlorine trifluoride ($ClF_3$) and iodine heptafluoride ($IF_7$).

<Additional Description 15>

Provided in still another embodiment according to the present invention is an attached substance removing method of removing an attached substance containing an iodine compound attached to a surface of a component included in a chamber or a surface of a pipe connected with the chamber by use of a cleaning gas containing a fluorine-containing gas that does not contain iodine.

<Additional Description 16>

Provided is the attached substance removing method according to additional description 15, wherein the fluorine-containing gas contained in the cleaning gas is fluorine ($F_2$) or chlorine trifluoride ($ClF_3$).

<Additional Description 17>

Provided is the attached substance removing method according to additional description 15, wherein the iodine compound contained in the attached substance is iodine pentafluoride ($IF_5$).

<Additional Description 18>

Provided in still another embodiment according to the present invention is a dry etching method, including:

an etching step of removing a film on a substrate with an etching gas containing an iodine-containing gas; and a post-process step of removing an iodine compound generated in the etching step;

wherein in the post-process step, a post-process gas containing a fluorine-containing gas that does not contain iodine is supplied to a surface of the substrate to remove the iodine compound.

<Additional Description 19>

Provided is the dry etching method according to additional description 18, further comprising a heating step of, after the post-process step, heating the substrate to remove the iodine compound deposited on the surface of the substrate.

<Additional Description 20>

Provided is the dry etching method according to additional description 18, wherein the fluorine-containing gas contained in the post-process gas is fluorine ($F_2$), chlorine trifluoride ($ClF_3$) or iodine heptafluoride ($IF_7$).

<Additional Description 21>

Provided in still another embodiment according to the present invention is a substrate processing device, including:

a chamber accommodating a substrate having a silicon-containing film, containing at least silicon as a main component, formed thereon;

an etching gas supply portion supplying an etching gas containing an iodine-containing gas into the chamber;

a cleaning gas supply portion supplying a cleaning gas containing a fluorine-containing gas into the chamber; and a device controller controlling at least the etching gas supply portion and the cleaning gas supply portion, and after supplying the first etching gas to perform etching on the substrate, removing an attached substance containing an iodine oxide attached to the inside of the chamber by use of the cleaning gas.

<Additional Description 22>

Provided in still another embodiment according to the present invention is a substrate processing device, including:

a chamber accommodating a substrate having a silicon-containing film, containing at least silicon as a main component, formed thereon;

an etching gas supply portion supplying an etching gas containing an iodine-containing gas to the substrate;

a post-process gas supply portion supplying a post-process gas containing a fluorine-containing gas to the substrate; and a control portion controlling at least the etching gas supply portion and the post-process gas supply portion such that the first etching gas is supplied into the chamber to expose the substrate to the first etching gas to remove the silicon-containing film, and then the post-process gas is supplied into the chamber to remove an iodine compound deposited on the substrate.

<Additional Description 23>

Provided in still another embodiment according to the present invention is a method for producing a semiconductor device, comprising:

a step of transporting a substrate into a chamber;

a step of adjusting a pressure in the chamber to a predetermined pressure;

an etching step of supplying an etching gas containing an iodine-containing gas to remove a silicon film on the substrate;

a post-process step of supplying a fluorine-containing gas different from the etching gas to remove an iodine compound attached to a surface of the substrate; and a step of transporting the substrate out of the chamber.

<Additional Description 24>

Provided is the method for producing a semiconductor device according to additional description 23, wherein in the post-process step, the temperature of the substrate is set to a temperature higher than, or equal to a sublimation temperature of the iodine compound.

<Additional Description 25>

Provided in still another embodiment according to the present invention are a program and a computer-readable storage medium, the program being readable from the computer-readable storage medium, the program causing a computer to execute:

a procedure of supplying a first etching gas (etching gas) containing an iodine-containing gas to perform etching on a substrate; and a procedure of removing an attached substance containing an iodine oxide attached to the inside of a chamber or a gas discharge pipe by use of a second etching gas (cleaning gas) containing at least a fluorine-containing gas.

<Additional Description 26>

Provided in still another embodiment according to the present invention are a program and a computer-readable storage medium, the program being readable from the computer-readable storage medium, the program causing a computer to execute:

a procedure of supplying an etching gas containing an iodine-containing gas to remove a silicon film on a substrate; and a procedure of supplying a fluorine-containing gas different from the etching gas to remove an iodine compound attached to a surface of the substrate.

<Additional Description 27>

Preferably provided is the program and a computer-readable storage medium, the program being readable from computer-readable storage medium, according to additional description 26, wherein the program causes the computer to execute a procedure of raising the temperature of the substrate to a temperature higher than, or equal to, a sublimation temperature of the iodine compound.

According to the present invention, etching is performed by use of an etching as such as iodine heptafluoride or the like, and then the generated iodine compound is removed. Therefore, an inconvenience regarding etching is suppressed.

What is claimed is:

1. An attached substance removing method of removing an attached substance containing an iodine oxide attached to a surface of a component included in a chamber or a surface of a pipe connected with the chamber by use of a cleaning gas containing a fluorine-containing gas in a plasma free state.

2. The attached substance removing method according to claim 1, wherein the cleaning gas is put into contact with the attached substance in a temperature range of 20° C. or higher and 300° C. or lower and in a pressure range of 66 Pa or higher and 101 kPa or lower.

3. The attached substance removing method according to claim 2, wherein:
   the fluorine-containing gas contained in the cleaning gas is $ClF_3$; and
   the temperature range is 25° C. or higher and 200° C. or lower.

4. The attached substance removing method according to claim 2, wherein:
   the fluorine-containing gas contained in the cleaning gas is $F_2$; and
   the temperature range is 120° C. or higher and 200° C. or lower.

5. The attached substance removing method according to claim 2, wherein:
   the fluorine-containing gas contained in the cleaning gas is $IF_7$; and
   the temperature range is 230° C. or higher and 300° C. or lower.

6. The attached substance removing method according to claim 1, wherein the fluorine-containing gas contained in the cleaning gas contains at least one type of fluorine (F) selected from the group consisting of HF, $F_2$, $XF_n$ (X represents any one of Cl, Br and I; and n represents an integer of 1 or greater and 7 or less).

7. The attached substance removing method according to claim 1, wherein the iodine oxide contained in the attached substance is represented by chemical formula $I_xO_yF_z$ (x represents an integer of 1 or 2, y represents an integer of 1 or greater and 5 or less, and z represents an integer of 0 or 1).

8. The attached substance removing method according to claim 7, wherein the iodine oxide is $I_2O_5$.

9. A dry etching method, comprising the steps of:
   supplying an etching gas containing an iodine-containing gas into a chamber and performing etching on a surface of a substrate; and
   after the etching is performed on the surface of the substrate, removing an attached substance containing an iodine oxide attached to a surface of a component included in the chamber or a surface of a pipe connected with the chamber by use of a cleaning gas containing a fluorine-containing gas in a plasma free state.

10. The dry etching method according to claim 9, wherein the cleaning gas is put into contact with the attached substance in a temperature range of 20° C. or higher and 300° C. or lower and in a pressure range of 66 Pa or higher and 101 kPa or lower.

11. The dry etching method according to claim 10, wherein the fluorine-containing gas contained in the cleaning gas is $ClF_3$.

12. The dry etching method according to claim 9, wherein the fluorine-containing gas contained in the cleaning gas contains at least one type of fluorine (F) selected from the group consisting of HF, $F_2$, $XF_n$ (X represents any one of Cl, Br and I; and n represents an integer of 1 or greater and 7 or less).

13. The dry etching method according to claim 9, wherein the iodine oxide contained in the attached substance is represented by chemical formula $I_xO_yF_z$ (x represents an integer of 1 or 2, y represents an integer of 1 or greater and 5 or less, and z represents an integer of 0 or 1).

14. An attached substance removing method of removing an attached substance containing an iodine compound attached to a surface of a component included in a chamber or a surface of a pipe connected with the chamber by use of a cleaning gas containing a fluorine-containing gas not containing iodine in a plasma free state.

15. The attached substance removing method according to claim 14, wherein the fluorine-containing gas contained in the cleaning gas is $F_2$ or $ClF_3$.

16. The attached substance removing method according to claim 14, wherein the iodine compound is $IF_5$.

17. A dry etching method, comprising:
   an etching step of removing a film on a substrate with an etching gas containing an iodine-containing gas; and
   a post-process step of removing an iodine compound generated in the etching step;
   wherein in the post-process step, a post-process gas containing a fluorine-containing gas not containing iodine is supplied to a surface of the substrate in a plasma free state to remove the iodine compound.

18. The dry etching method according to claim 17, further comprising a heating step of, after the post-process step, heating the substrate to remove the iodine compound deposited on the surface of the substrate.

19. The dry etching method according to claim 17, wherein the fluorine-containing gas contained in the post-process gas is $F_2$ or $ClF_3$.

20. An attached substance removing method of removing an attached substance containing an iodine oxide attached to a surface of a component included in a chamber or a surface of a pipe connected with the chamber by use of a cleaning gas containing $IF_7$.

21. The attached substance removing method according to claim 20, wherein the cleaning gas is put into contact with the attached substance in a temperature range of 230° C. or higher and 300° C. or lower and in a pressure range of 66 Pa or higher and 101 kPa or lower.

* * * * *